(12) United States Patent
Seo et al.

(10) Patent No.: US 8,366,827 B2
(45) Date of Patent: Feb. 5, 2013

(54) CHAMBER INSERTS AND APPARATUSES FOR PROCESSING A SUBSTRATE

(75) Inventors: Jung-Hun Seo, Suwon-si (KR); Jin-Gi Hong, Suwon-si (KR); Kyung-Bum Koo, Yongin-si (KR); Yun-Ho Choi, Yongin-si (KR); Eun-Taeck Lee, Suwon-si (KR); Hyun Chul Kwun, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1014 days.

(21) Appl. No.: 11/447,933

(22) Filed: Jun. 7, 2006

(65) Prior Publication Data

US 2007/0000109 A1    Jan. 4, 2007

(30) Foreign Application Priority Data

Jun. 29, 2005    (KR) .................. 10-2005-0056734

(51) Int. Cl.
*C23C 16/00* (2006.01)
*C23F 1/00* (2006.01)
*H01L 21/306* (2006.01)

(52) U.S. Cl. .................................... 118/715; 156/345.1

(58) Field of Classification Search .................. 118/715; 156/345.1
See application file for complete search history.

(56) References Cited

U.S. PATENT DOCUMENTS

| | | | | |
|---|---|---|---|---|
| 5,552,124 A * | 9/1996 | Su | ............................... | 156/345.1 |
| 5,914,050 A * | 6/1999 | Comita et al. | .................. | 216/58 |
| 6,394,026 B1 * | 5/2002 | Wicker et al. | .............. | 156/345.1 |
| 6,802,906 B2 * | 10/2004 | Jin et al. | ......................... | 118/715 |
| 2002/0007797 A1 * | 1/2002 | Stevens et al. | ................. | 118/724 |
| 2003/0019428 A1 * | 1/2003 | Ku et al. | ......................... | 118/715 |
| 2005/0121143 A1 * | 6/2005 | Daugherty et al. | ....... | 156/345.29 |
| 2007/0113783 A1 * | 5/2007 | Lee et al. | ....................... | 118/715 |

FOREIGN PATENT DOCUMENTS

| | | |
|---|---|---|
| JP | 2004-039658 | 2/2004 |
| KR | 1998-0009511 | 4/1998 |
| KR | 10-2004-0081124 | 9/2004 |
| KR | 10-2005-0061950 A | 6/2005 |

OTHER PUBLICATIONS

Korean Office Action dated Jul. 28, 2006 for corresponding Korean Patent Application No. 10-2005-0056734.

* cited by examiner

*Primary Examiner* — Maureen Gramaglia
(74) *Attorney, Agent, or Firm* — Harness, Dickey & Pierce, P.L.C.

(57) ABSTRACT

Disclosed are chamber inserts and apparatuses using the chamber inserts. A chamber insert may include a cylindrical body portion including a top end portion and a bottom end portion, a first protruding portion extending outwardly from a first portion of the cylindrical body portion, the first portion positioned circumferentially along the cylindrical body portion and a second protruding portion extending outwardly from a second portion of the cylindrical body portion, the second portion positioned circumferentially along less than all of the cylindrical body portion. In another example, the chamber insert may include a cylindrical body portion including a top end portion and a bottom end portion, the cylindrical body portion including a slit and at least one hole, the slit and the at least one hole positioned circumferentially along the cylindrical body portion and a first protruding portion extending outwardly from a first portion of the cylindrical body portion.

5 Claims, 25 Drawing Sheets

2.0%

← AROUND EXHAUST HOLE    AROUND GATE WAY →

7.6e-6           9.4e-7

← AROUND EXHAUST HOLE    AROUND GATE WAY →

AROUND EXHAUST HOLE          AROUND GATE WAY

AROUND EXHAUST HOLE          AROUND GATE WAY

← AROUND EXHAUST HOLE     AROUND GATE WAY →

5.3e-6                    6.4e-7

← AROUND EXHAUST HOLE     AROUND GATE WAY →

AROUND EXHAUST HOLE       AROUND GATE WAY

AROUND EXHAUST HOLE       AROUND GATE WAY

← AROUND EXHAUST HOLE          AROUND GATE WAY →

← AROUND EXHAUST HOLE          AROUND GATE WAY →

← AROUND EXHAUST HOLE     AROUND GATE WAY →

← AROUND EXHAUST HOLE     AROUND GATE WAY →

AROUND EXHAUST HOLE  AROUND GATE WAY

AROUND EXHAUST HOLE  AROUND GATE WAY

← AROUND EXHAUST HOLE     AROUND GATE WAY →

← AROUND EXHAUST HOLE     AROUND GATE WAY →

3.5%

←——— AROUND EXHAUST HOLE　　　AROUND GATE WAY ———→

4.2e-13　　　8.6e-15

←——— AROUND EXHAUST HOLE　　　AROUND GATE WAY ———→

AROUND EXHAUST HOLE     AROUND GATE WAY

AROUND EXHAUST HOLE     AROUND GATE WAY

AROUND EXHAUST HOLE     AROUND GATE WAY

AROUND EXHAUST HOLE     AROUND GATE WAY

US 8,366,827 B2

CHAMBER INSERTS AND APPARATUSES FOR PROCESSING A SUBSTRATE

PRIORITY STATEMENT

This application claims benefit of priority under 35 USC §119 from Korean Patent Application No. 2005-56734, filed on Jun. 29, 2005, in the Korean Intellectual Property Office, the content of which is herein incorporated by reference in its entirety.

BACKGROUND OF THE INVENTION

1. Field of the Invention

Example embodiments of the present invention are directed generally to chamber inserts and apparatuses, and more particularly to chamber inserts and apparatuses for processing a substrate.

2. Description of the Related Art

Modern semiconductor devices may be manufactured to have higher degrees of integration, more reliability and increased operation speeds. Conventional semiconductor devices may be manufactured on a silicon wafer obtained from a silicon ingot having a single-crystal structure. A plurality of relatively thin layers may be formed on the silicon wafer which may be developed into a plurality of patterns having electrical characteristics which may collectively function as the semiconductor device.

Conventional semiconductor devices may be manufactured by sequentially performing processes (e.g., deposition, photolithography, etching, ion implantation, polishing, etc.) on a semiconductor substrate such as a silicon wafer. For example, the deposition process may be performed so as to form the thin layer on the wafer in a deposition system including a processing chamber. The processing chamber of the deposition system may include a uniformity member for enhancing a uniformity of the thin layer deposited therein. In an example, an emissivity-change-free pumping plate kit for absorbing heat emitted from a susceptor in a processing chamber may be used as the uniformity member. The example processing chamber may include a chamber insert and inner and outer shields around a stage on which a substrate to be processed may be positioned.

FIG. 1 is a perspective view illustrating a conventional chamber insert 10. Referring to FIG. 1, the conventional chamber insert 10 may include a shallow cylindrical body 12, a first protruding portion 14 outwardly protruding from a lower portion of the shallow cylindrical body 12 and a second protruding portion 16 outwardly protruding from an upper portion of the shallow cylindrical body 12. A slit 18 through which the substrate may be loaded and/or unloaded may be provided at a side surface of the shallow cylindrical body 12.

Referring to FIG. 1, while a uniform gas flow may be attained with the uniformity member including the chamber insert 10 and the inner and outer shields in the processing chamber, the uniformity member may also disrupt the gas flow in the processing chamber. Accordingly, an inner pressure of the processing chamber may be difficult to maintain stably at lower levels.

Because of such difficulties, the inner and outer shields may be withdrawn from the uniformity member so as to maintain the inner pressure of the processing chamber at more stable, lower levels, such that the uniformity member may only include the chamber insert 10. However, the removal of the inner and outer shields may increase a distance between the chamber insert 10 and the stage, such that a greater amount of purge gas may need to be supplied to the processing chamber through a lower portion of the stage. The purge gas may be used to reduce (e.g., prevent) a source gas of the deposition process from being deposited at the lower portion of the stage. Generally, greater levels of purge gas supplied to the processing chamber may reduce the uniformity of the thin layer on the substrate, which may be mounted on the stage. Further, greater amounts of purge gas supplied to the processing chamber may also lower the deposition rate (e.g., at a peripheral portion of the substrate).

SUMMARY OF THE INVENTION

An example embodiment of the present invention is directed to a chamber insert, including a cylindrical body portion including an open top end portion and an open bottom end portion, a first protruding portion extending outwardly from a first portion of the cylindrical body portion, the first portion positioned circumferentially along the cylindrical body portion and a second protruding portion extending outwardly from a second portion of the cylindrical body portion, the second portion positioned circumferentially along less than all of the cylindrical body portion.

Another example embodiment of the present invention is directed to a chamber insert, including a cylindrical body portion including an open top end portion and an open bottom end portion, the cylindrical body portion including a slit and at least one hole, the slit and the at least one hole positioned circumferentially along the cylindrical body portion and a first protruding portion extending outwardly from a first portion of the cylindrical body portion.

Another example embodiment of the present invention is directed to an apparatus for processing a substrate, including a chamber including the substrate to be processed with a received source gas, the chamber including a gateway through which the substrate passes and an exhaust hole through which inner gases are exhausted, a stage on which the substrate is positioned in the chamber and a chamber insert including a cylindrical body portion including an open top end portion and an open bottom end portion, a first protruding portion extending outwardly from a first portion of the cylindrical body portion, the first portion positioned circumferentially along the cylindrical body portion and a second protruding portion extending outwardly from a second portion of the cylindrical body portion, the second portion positioned circumferentially along less than all of the cylindrical body portion, the cylindrical body portion positioned a given distance away from the stage.

Another example embodiment of the present invention is directed to an apparatus for processing a substrate, including a chamber including the substrate to be processed with a received source gas, the chamber including a gateway through which the substrate passes and an exhaust hole through which inner gases are exhausted, a stage on which the substrate is positioned in the chamber and a chamber insert including a cylindrical body portion including an open top end portion and an open bottom end portion, the cylindrical body portion including a slit and at least one hole, the slit and the at least one hole positioned circumferentially along the cylindrical body portion and a first protruding portion extending outwardly from a first portion of the cylindrical body portion.

Another example embodiment of the present invention is directed to a chamber insert for providing a processing gas as a uniform flow in the processing chamber and for improving a degree of vacuum of the processing chamber.

Another example embodiment of the present invention is directed to an apparatus for processing a substrate including a chamber insert.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
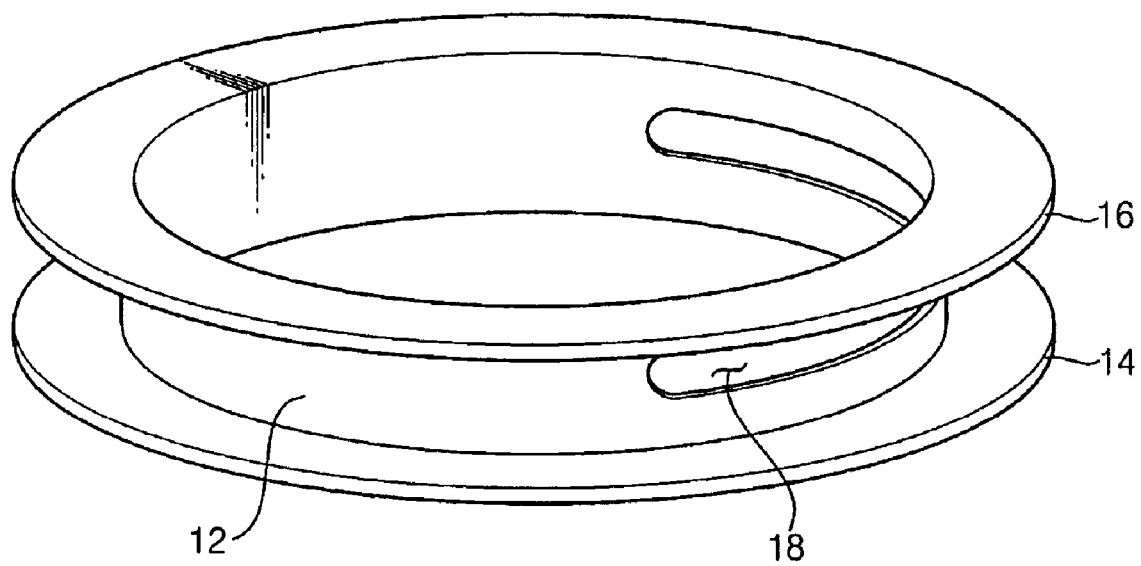
FIG. 1 is a perspective view illustrating a conventional chamber insert.

Example embodiments of the present invention will be described with reference to the accompanying drawings. The present invention may, however, be embodied in many different forms and should not be construed as limited to the example embodiments set forth herein. Rather, the example embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the size and relative sizes of layers and regions may be exaggerated for clarity. The drawings are not to scale. Like reference numerals refer to like elements throughout.

It will be understood that when an element or layer is referred to as being "on", "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, there may be no intervening elements or layers present. As used herein, the term "and/or" may include any and all combinations of one or more of the associated listed items.

It will be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein.

Example embodiments of the present invention may be below described with reference to cross-section illustrations that are schematic illustrations of idealized embodiments of the present invention. As such, variations from the shapes of the illustrations as a result, for example, of manufacturing techniques and/or tolerances, may be expected. Thus, example embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature of a device and are not intended to limit the scope of the present invention.

Although the following example embodiments of the present invention have been described having a deposition source gas as a processing gas, it is understood that the present invention should not be limited to the deposition source gas. Accordingly, other example embodiments of the present invention may be directed to any well-known type of processing gas (e.g., an etching gas).

Figure 2:
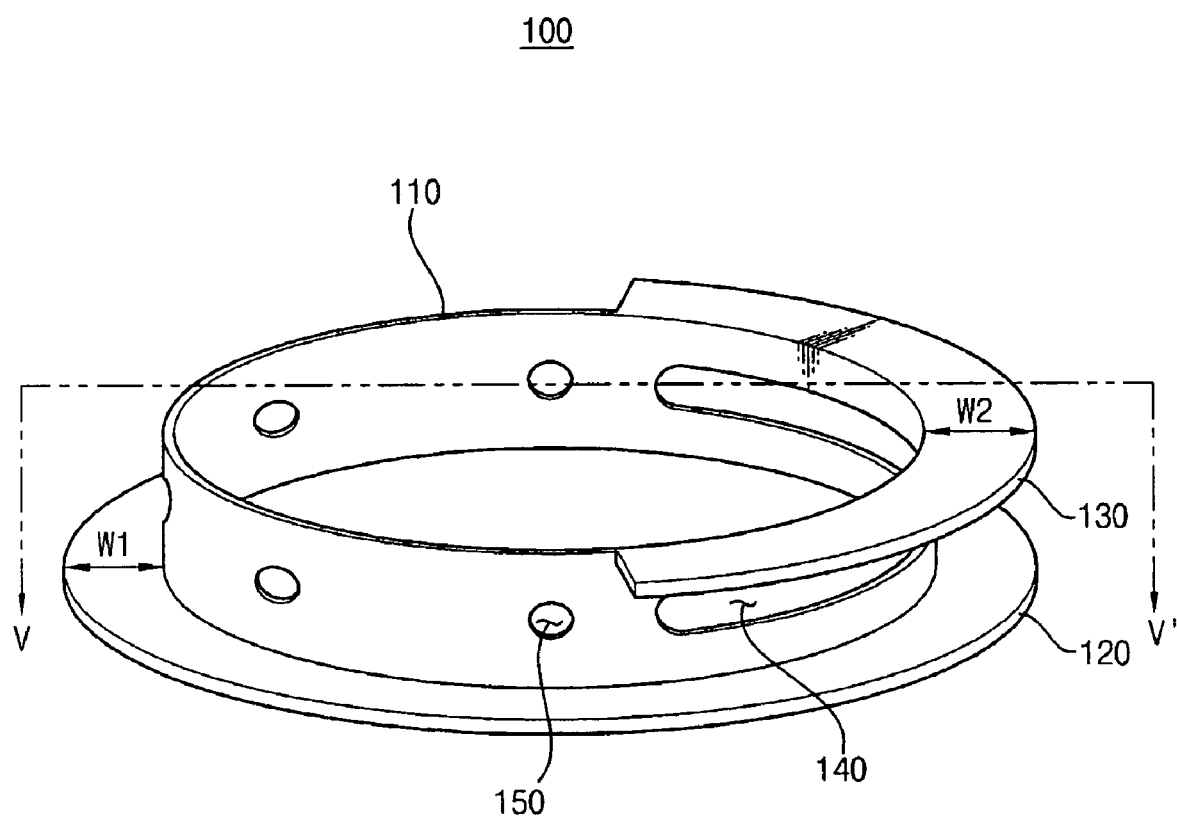
FIG. 2 is a perspective view illustrating a chamber insert according to an example embodiment of the present invention.
Figure 3:
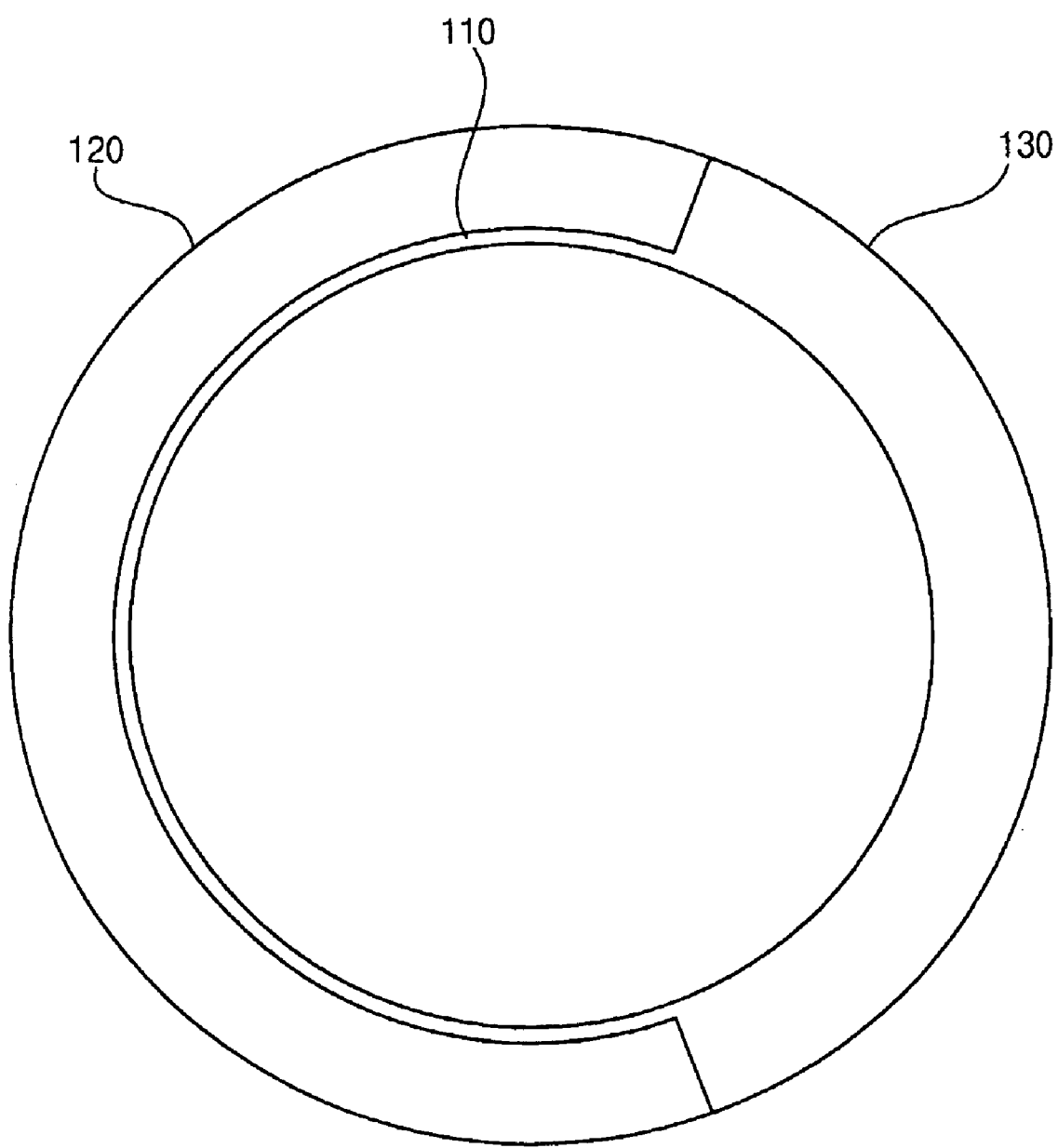
FIG. 3 is a plan view illustrating the chamber insert of FIG. 2.
Figure 4:
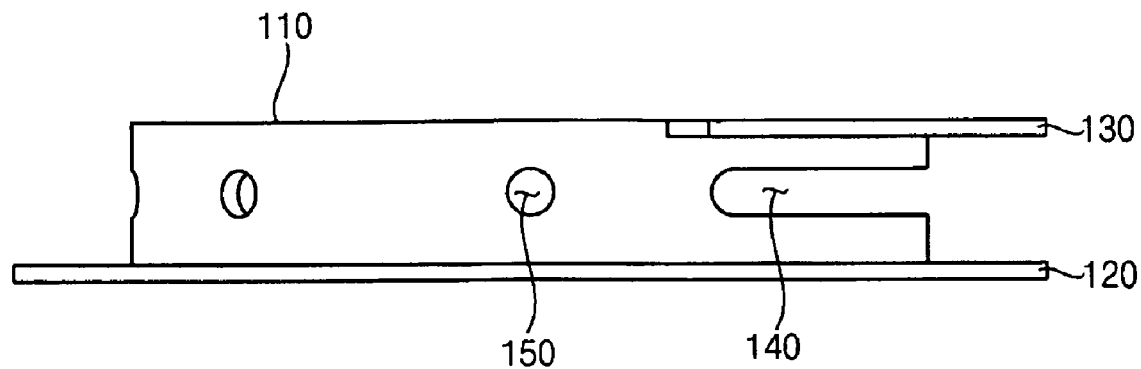
FIG. 4 is a front view illustrating the chamber insert of FIG. 2.
Figure 5:
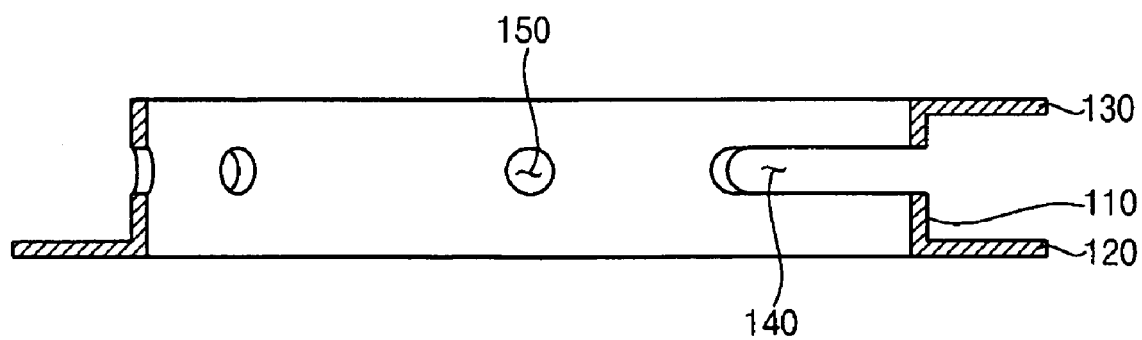
FIG. 5 is a cross sectional view illustrating the chamber insert taken along a line V-V' of FIG. 2.

FIG. 2 is a perspective view illustrating a chamber insert 100 according to an example embodiment of the present invention. FIG. 3 is a plan view illustrating the chamber insert 100 of FIG. 2. FIG. 4 is a front view illustrating the chamber insert 100 of FIG. 2. FIG. 5 is a cross sectional view illustrating the chamber insert 100 taken along a line V-V' of FIG. 2.

In the example embodiment of FIGS. 2 to 5, the chamber insert 100 may include a body 110, a first protruding portion 120 and a second protruding portion 130. In an example, the body 110 may be shaped as a shallow cylinder with a given diameter. The body 110 may be positioned a given distance from a stage (not shown) on which a substrate may be mounted. In a further example, an outer diameter and a height of the body 110 may be determined in accordance with a size of the stage.

In the example embodiment of FIGS. 2 to 5, a slit 140 may be formed at a side surface of the body 110, and the substrate may be loaded onto and/or unloaded from the stage via the slit 140. In an example, the slit 140 may be narrowly formed at the side surface of the body 110 in a circumferential direction of the cylindrical body 110. A fist portion of the side surface of the body 110 may be removed in the circumferential direction, thereby forming the slit 140 at the first portion of the side surface of the body 110.

In the example embodiment of FIGS. 2 to 5, a plurality of holes 150 may be formed at a second portion of the side surface of the body 110 (e.g., a remaining portion of the side surface excluding the first portion). The plurality of holes 150 may be spaced apart from one another by a given distance (e.g., a uniform distance for each of the plurality of holes 150) along the circumferential direction of the cylindrical body 110. The plurality of holes 150 may thereby be distributed (e.g., uniformly distributed) on the second portion of the side surface of the body 110.

In the example embodiment of FIGS. 2 to 5, a flow of a processing gas may become unstable (e.g., turbulent) and/or non-uniform around the body 110 of the chamber insert 100 due to the slit 140 at the first portion of the side surface of the body 110, and the plurality of holes 150 may, at least partially, prevent the gas flow from being unstable (e.g., turbulent) and/or non-uniform. Accordingly, the turbulence and non-uniformity of the gas flow around the body portion 110 may be reduced (e.g., minimized) by the plurality of holes 150.

In the example embodiment of FIGS. 2 to 5, if a source gas for a deposition process is supplied onto the stage including the substrate as the processing gas, a given amount of the source gas may be outwardly discharged from the body 110 through the slit 140. However, the source gas may also be outwardly discharged from the body 110 through the plurality of holes 150 (e.g., which may collectively be an amount substantially the same as the amount of the source gas discharged through the slit 140), such that a pressure gradient may be reduced (e.g., minimized) across the slit 140 and the plurality of holes 150 in the flow of the source gas. Accordingly, the flow of the source gas in the body 110 may still maintain a substantially stable flow (e.g., referred to as a "quasi-steady flow"), even though the source gas may be discharged through the slit 140. Accordingly, the plurality of holes 150 may help to maintain the gas flow stably around the body 110 irrespective of instability incurred via a discharge through the slit 140.

In the example embodiment of FIGS. 2 to 5, a first purge gas may be supplied to a processing chamber from a bottom portion of the stage. The first purge gas may reduce (e.g., prevent) an amount of the source gas deposited onto the bottom portion of the stage. Further, a second purge gas may be supplied to a top portion of the stage after penetrating the stage. The second purge gas may be supplied into a boundary area between the stage and the substrate on the stage. Accordingly, an amount of the source gas deposited onto the top portion of the stage and/or a rear surface of the substrate may be reduced. The first and second purge gases may flow out of the body 110 through the slit 140, and the out-flowed first and second purge gases may cause a disturbance in the flow of the source gas directed to the stage. However, the first and second purge gases may also flow out of the body 110 through the plurality of holes 150 in addition to the slit 140, thereby reducing an amount of the purge gases discharged/outflowed through the slit 140 compared with a conventional chamber insert (e.g., chamber insert 10 of conventional FIG. 1). In an example, the amount of the purge gases discharged through the slit 140 may be similar to that of the first and second purge gases discharged through the plurality of holes 150, thereby reducing (e.g., minimizing) the disturbance or instability of the source gas flow around the body 110.

While the example embodiment of FIGS. 2 to 5 illustrates the plurality of holes 150 each embodied as having a "circular" shape, other shapes (e.g., an eclipse shape, any type of polygonal shape, etc.) may be employed in other example embodiments of the present invention either in place of or in conjunction with the above-described circular shape.

In the example embodiment of FIGS. 2 to 5, the first protruding portion 120 may extend from a lower peripheral portion of the body 110 in a direction angling away from the body 110, for example, so as to be substantially perpendicular to the body 110. In an example, referring to FIG. 2, the first protruding portion 120 may protrude to the same degree at each point along the lower peripheral portion of the body 110, such that the first protruding portion 120 may have a uniform width W1 along an edge line of the body 110. However, while not illustrated in FIGS. 2 to 5, the first protruding portion 120 may have a non-uniform width along the edge line of the body 110 in other example embodiments of the present invention.

In the example embodiment of FIGS. 2 to 5, the second protruding portion 130 may extend from an upper peripheral portion of the body 110 in a direction angling away from the body 110. In an example, the second protruding portion 130 may extend from regions along the body 110 corresponding to the slit 140 and may have a circumferential length L, where L may be greater than or equal to a length of the slit 140.

In the example embodiment of FIGS. 2 to 5, the second protruding portion 130 may be oriented so as to be substantially perpendicular with respect to the body 110. In an example, referring to FIG. 3, the second protruding portion 130 may also protrude to the same degree at each point along the upper peripheral portion of the body 110, such that the second protruding portion 130 may have a uniform width W2 along an edge line of the body 110. However, while not illustrated in FIGS. 2 to 5, the second protruding portion 130 may have a non-uniform width along the edge line of the body 110 in other example embodiments of the present invention.

In the example embodiment of FIGS. 2 to 5, in an example, the first width W1 of the first protruding portion 120 may be substantially the same as the second width W2 of the second protruding portion 130 irrespective of whether the first and second widths W1 and W2 are uniform.

In the example embodiment of FIGS. 2 to 5, in an example, the first and second purge gases may be discharged through the plurality of holes 150 and the slit 140 such that the flow of the first and second purge gases may be slightly unsteady around the first portion of the side surface of the body 110 where the slit 140 is formed because the amount of the purge gases discharged through the slit 140 may be slightly more than that of the purge gases discharged through the plurality of holes 150. The second protruding portion 130 may reduce (e.g., prevent) an amount of purge gases discharged through the slit 140 from being diffused outwardly, thereby reducing (e.g., minimizing) the disturbance and non-uniformity of the flow of the source gas.

In the example embodiment of FIGS. 2 to 5, the second protruding portion 130 may not be formed on the second side surface of the body 110, including the plurality of holes 150, such that a flow rate of discharged gases may be improved in the processing chamber. For example, an inside of the processing chamber may be formed into a vacuous state in a shorter period of time due to the increased flow rate of the discharged gases. In addition, an inner pressure of the processing chamber, which may be increased by an in-flowing processing gas, may be reduced, such that the processing chamber may have a lower and stable vacuum degree in a shorter period of time.

In the example embodiment of FIGS. 2 to 5, the chamber insert 100 positioned around the stage may maintain the inside of the processing chamber vacuous at a lower vacuum degree and may further maintain a flow of gases in a substantially uniform state around the stage. As a result, a thin layer may be uniformly formed on the substrate by a deposition process.

Figure 6:
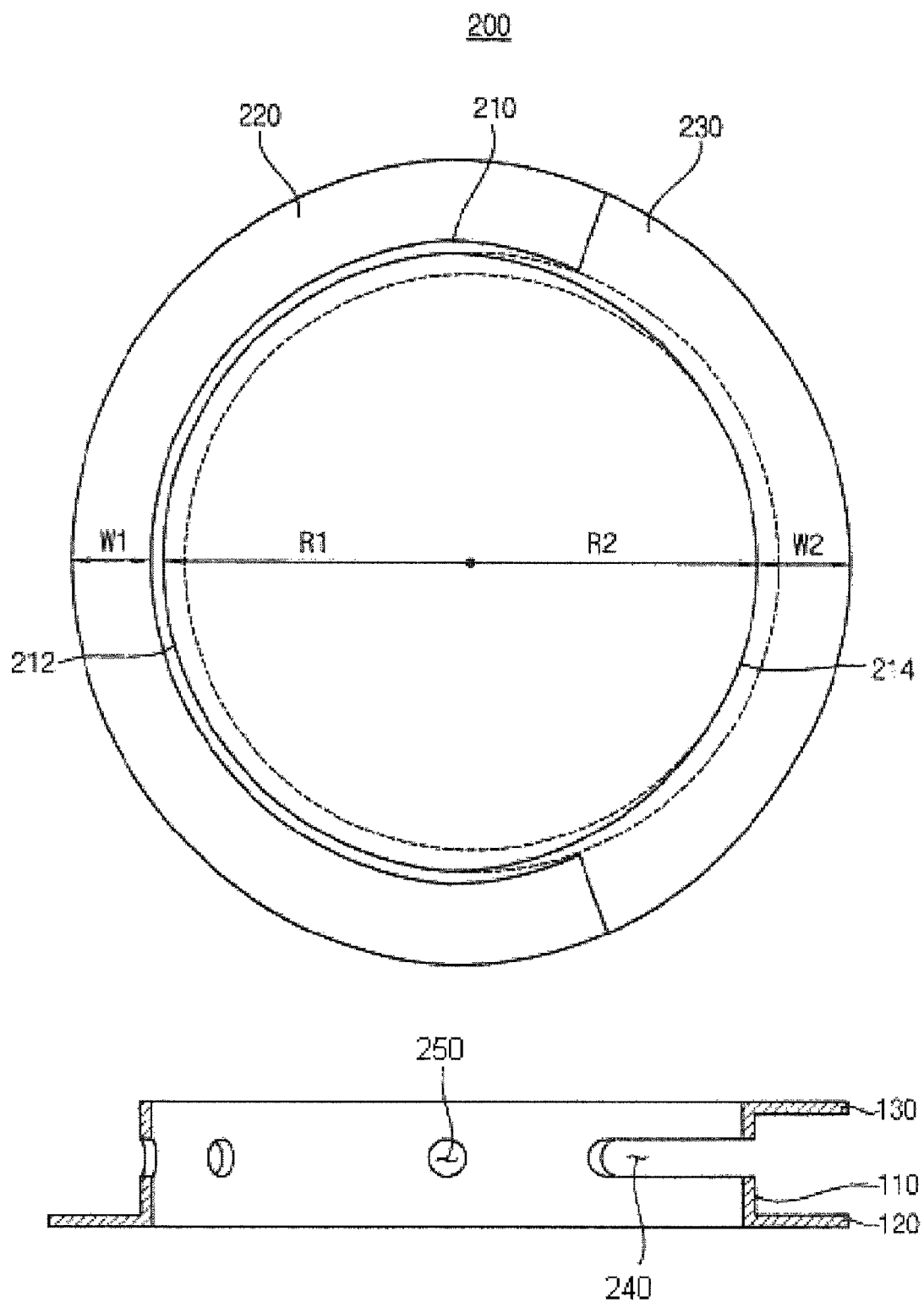
FIG. 6 is a plan view illustrating a chamber insert according to another example embodiment of the present invention.

FIG. 6 is a plan view illustrating a chamber insert 200 according to another example embodiment of the present invention.

In the example embodiment of FIG. 6, the chamber insert 200 may include a body 210, a first protruding portion 220 and a second protruding portion 230. In an example, the body 210 may be embodied as an asymmetrical shallow cylinder. The body may include a first portion 212 having a first radius R1 and a second portion 214 having a second radius R2 which may be smaller than the first radius R1 of the first portion 212. In an example, the center of the first portion 212 of the body 210 may be coincident with that of the second portion 214 of the body 210, such that the body 210 may have an asymmetrical shape. In other example embodiments of the present invention, however, it is understood that the center of the first portion 212 of the body 210 may not be coincident with that of the second portion 214 of the body 210.

In the example embodiment of FIG. 6, a slit 240 may be formed at a side surface of the body 210. A substrate may be loaded onto and/or unloaded from a stage through the slit 240.

In an example, the slit 240 may be narrowly formed at the side surface of the body 210 in a circumferential direction of the cylindrical body 210. A first portion of the side surface of the body 210 may be removed/detached in the circumferential direction, thereby forming the slit 240 at the first portion of the side surface of the body 210.

In the example embodiment of FIG. 6, a plurality of holes 250 may be formed at a second portion of the side surface of the body 210 (e.g., a remaining portion of the side surface excluding the first portion). The plurality of holes 250 may be spaced apart by a given distance (e.g., a uniform distance) along a circumferential direction (e.g., the circumference) of the cylindrical body 210. The plurality of holes 250 may be uniformly distributed at the second portion of the side surface of the body 210 (e.g., and not at the first portion corresponding to the slit 240).

In the example embodiment of FIG. 6, the first protruding portion 220 may extend from a lower peripheral portion of the body 210 in a direction angling away from the body 210 (e.g., substantially perpendicular to the body 210. In an example, referring to FIG. 6, the first protruding portion 220 may protrude to the same degree at each point along the lower peripheral portion of the body 210 such that the first protruding portion 220 may have a uniform width W1 along an edge line of the body 210. While not illustrated in FIG. 6, the first protruding portion 220 may have a non-uniform width along the edge line of the body 210 in other example embodiments of the present invention. For example, a protruding length of the first protruding portion 220 may be longer at the lower peripheral portion of the second portion 214 of the body 210 than at the lower peripheral portion of the first portion 212 of the body 210. In an example, a difference of the protruding length of the first protruding portion 220 between the first and second portions of the body 210 may be substantially the same as a difference of the first and second radiuses.

In the example embodiment of FIG. 6, the second protruding portion 230 may extend from an upper peripheral portion of the body 210 in a direction angling away from the body 110 and substantially perpendicular to the body 220. The second protruding portion 230 may extend from positions circumferentially corresponding to the slit 240 and may have a circumferential length at least equal to that of the slit 240.

In the example embodiment of FIG. 6, the second protruding portion 230 may protrude to the same degree at each point of the upper peripheral portion of the second portion 214 of the body 210 such that the second protruding portion 230 may have a uniform width W2 along an edge line of the body 210. A protrusion length of the second protruding portion 240 may be substantially the same as that of the first protruding portion 230 at the lower peripheral portion of the second portion 214 of the body 210.

In the example embodiment of FIG. 6, the chamber insert 200 positioned around the stage may maintain the interior of the processing chamber vacuous at a lower vacuum degree and may maintain a flow of gases in a uniform state around the stage, thereby allowing a thin layer to be uniformly formed on the substrate by a deposition process.

Figure 7:
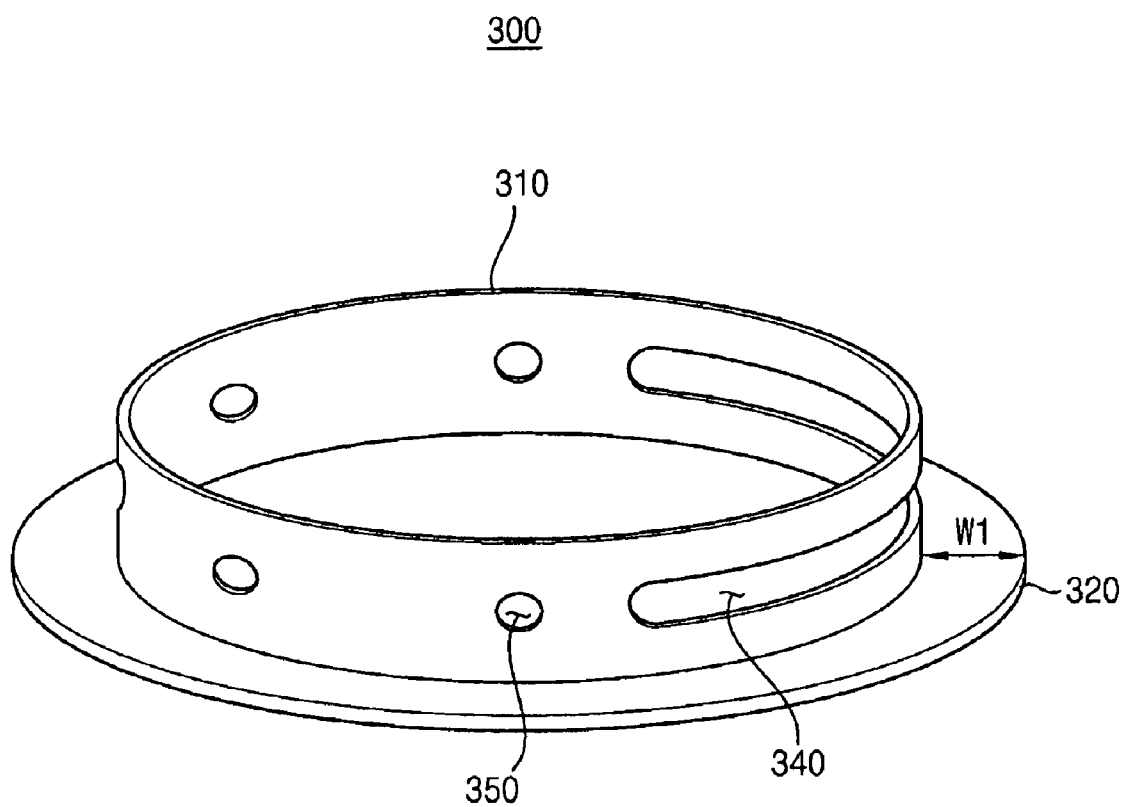
FIG. 7 is a perspective view illustrating a chamber insert according to another example embodiment of the present invention.

FIG. 7 is a perspective view illustrating a chamber insert 300 according to another example embodiment of the present invention.

In the example embodiment of FIG. 7, the chamber insert 300 may include a body 310 and a protruding portion 320. The body 310 may have a shallow cylindrical shape with a given radius. In an example, the body 310 of FIG. 7 may have the same shape as the body 110 of FIGS. 2 to 5. Accordingly, the body 310 may be shaped into an asymmetrical shallow cylinder and may include a first portion having a first radius and a second portion having a second radius, with the second radius being different (e.g., less than) from the first radius of the first portion.

In the example embodiment of FIG. 7, a slit 340 may be formed at a side surface of the body 310. In an example, a substrate may be loaded and/or unloaded onto/from the stage through the slit 340. In a further example, the slit 340 may be narrowly formed at the side surface of the body 310 in a circumferential direction of the cylindrical body 310. A first portion of the side surface of the body 310 may be removed in the circumferential direction, thereby forming the slit 340 at the first portion of the side surface of the body 310.

In the example embodiment of FIG. 7, a plurality of holes 350 may be formed at a side surface of the body 310. The plurality of holes 350 may be embodied as described above with respect to the plurality of holes 150 of FIGS. 2 to 5. Accordingly, further description of the plurality of holes 350 has been omitted for the sake of brevity.

In the example embodiment of FIG. 7, the protruding portion 320 may extend from a lower peripheral portion of the body 310 in a direction angling away from the body 310 and substantially perpendicular to the body 310. The first protruding portion 320 may protrude to the same degree at each point of the lower peripheral portion of the body 310 such that the protruding portion 320 may have a uniform width W1 along an edge line of the body 310. Although not illustrated in FIG. 7, in another example embodiment of the present invention, the protruding portion 320 may have a non-uniform width along the edge line of the body 310.

In the example embodiment of FIG. 7, the chamber insert 300 positioned around the stage may maintain the interior of the processing chamber vacuous at a lower vacuum degree and may further maintain a flow of gases in a uniform state around the stage, thereby allowing a thin layer to be uniformly formed on the substrate by a deposition process.

Figure 8:
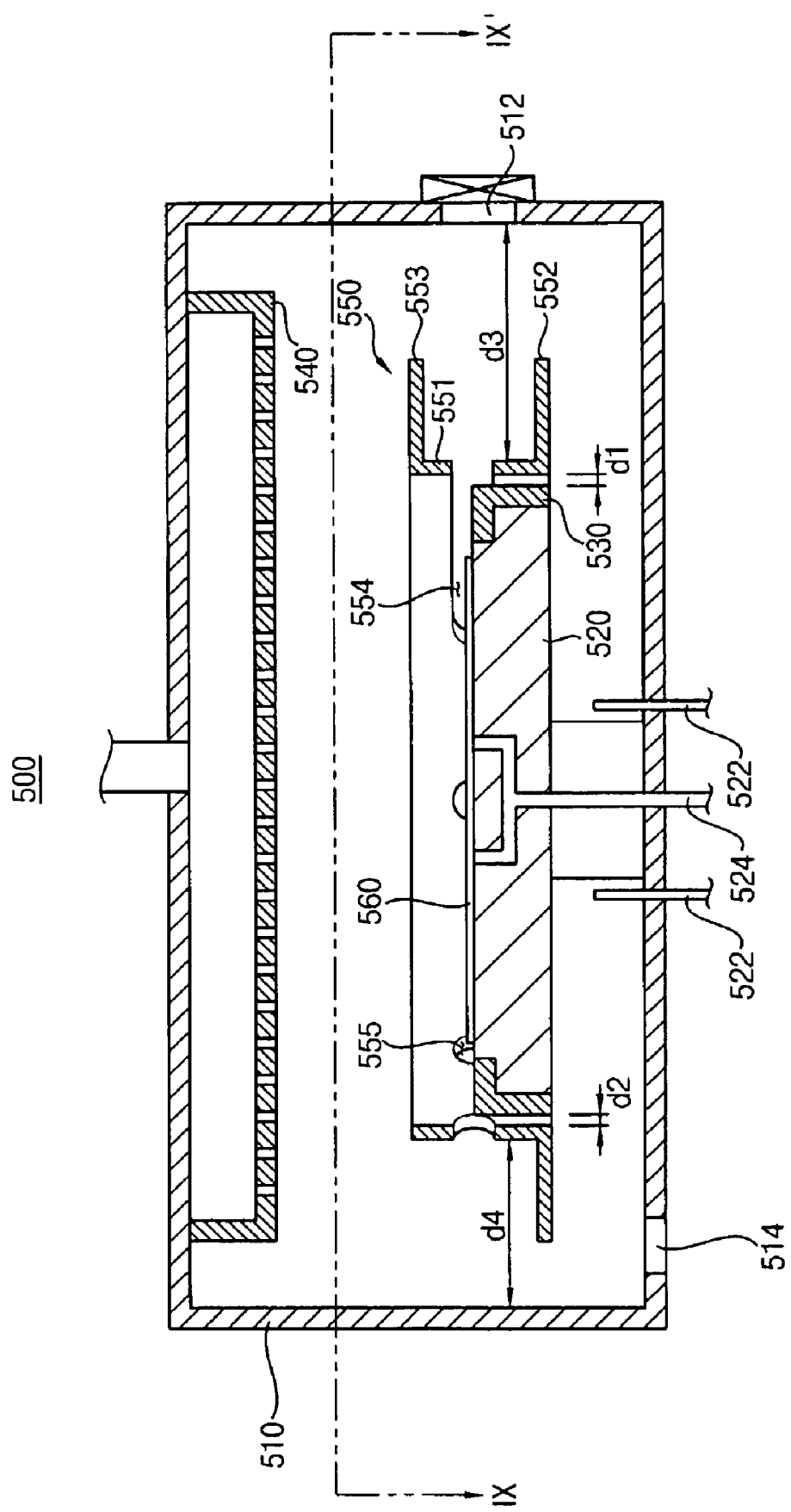
FIG. 8 is a cross sectional view illustrating an apparatus for processing a substrate according to another example embodiment of the present invention.
Figure 9:
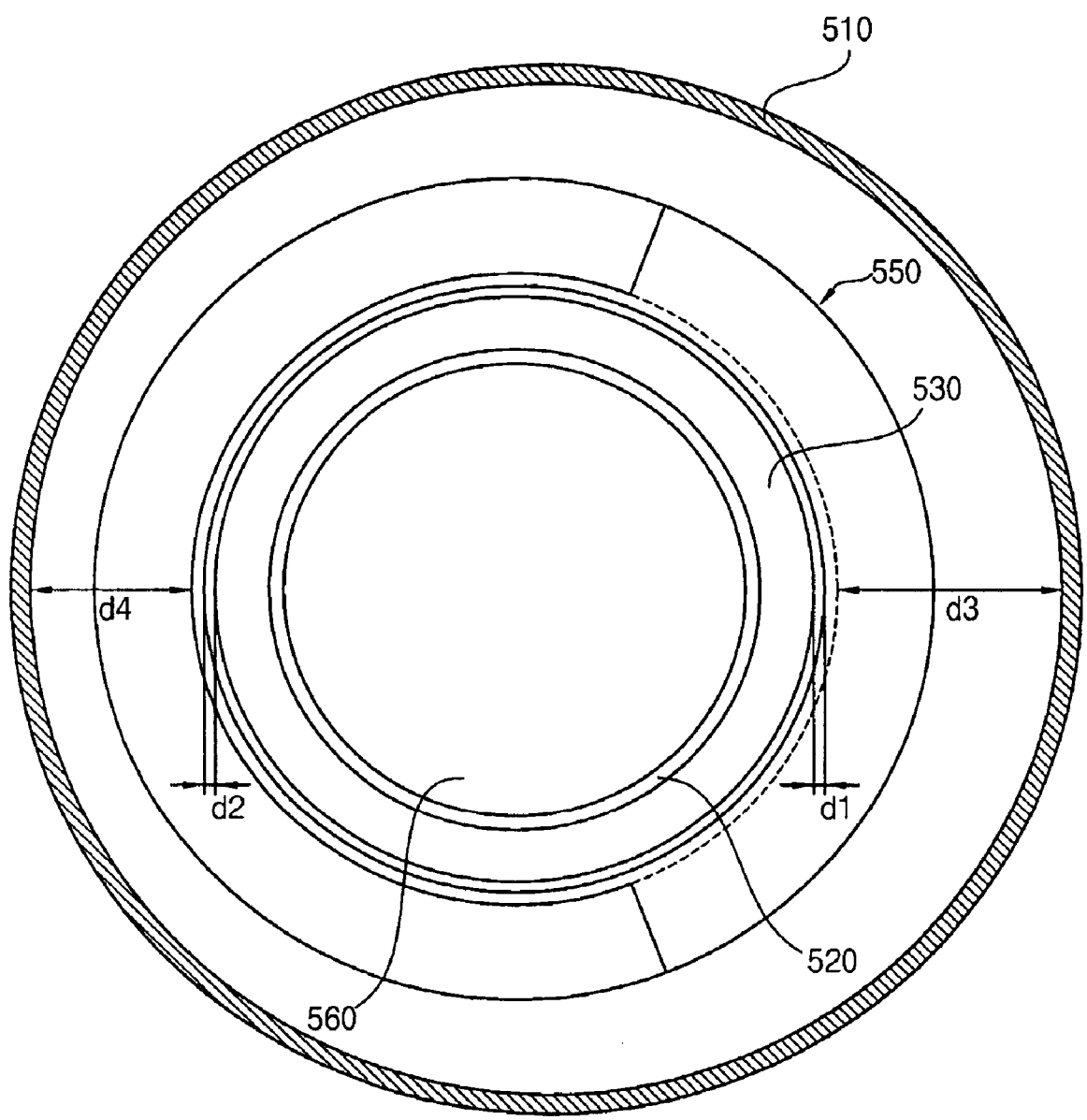
FIG. 9 is a cross sectional view taken along a line IX-IX' in FIG. 8.

FIG. 8 is a cross sectional view illustrating an apparatus 500 for processing a substrate 560 according to another example embodiment of the present invention. FIG. 9 is a cross sectional view taken along a line IX-IX' in FIG. 8.

In the example embodiment of FIGS. 8 and 9, the apparatus 500 may be configured for processing a substrate (e.g., referred to as a substrate-processing apparatus). The apparatus 500 may include a chamber 510, a stage 520, an edge ring 530, a shower head 540 and a chamber insert 550. The chamber 510 may be shaped into a shallow cylinder in which a space may be prepared for processing a substrate 560. For example, a deposition process may be performed on the substrate 560 such that a thin layer may be formed on the substrate 560. A gateway 512 may be formed on a side surface of the chamber 510 (e.g., as a slit shape) such that the substrate 560 may be loaded into the chamber 510 through the gateway 512. The gateway 512 may be operated by a slit valve (not shown) and may be formed to a similar shape as a slit 554 of the chamber insert 550.

In the example embodiments of FIGS. 8 and 9, an exhaust hole 514 may be positioned at a bottom portion of the chamber 510 opposite to the gateway 512. In an example, a vacuum pump (not shown) may be connected to the exhaust hole 514.

In the example embodiments of FIGS. 8 and 9, residual processing gases which have not reacted with the substrate 560 and byproducts of the chemical reaction in the chamber 510 may be exhausted through the exhaust hole 514 such that the interior of the chamber 510 may achieve a vacuous state through the exhaust hole 514.

In the example embodiments of FIGS. 8 and 9, the gateway 512 and the exhaust hole 514 may be positioned at different portions from each other with respect to a central line of the chamber 510. In an example, the gateway 512 and the exhaust hole 514 may be positioned opposite of each other with respect to the central line of the chamber 510.

In the example embodiment of FIGS. 8 and 9, the stage 520 may be shaped as a disk and the substrate 560 may be positioned on a surface of the stage 520. A stepped portion may be formed at a peripheral portion of the stage 520 and the stage 520 may be eccentrically (e.g., asymmetrically or not centered) positioned at a lower portion of the chamber 510. In an example, the stage 520 may be positioned relatively apart (e.g., separated by a first distance) from a first sidewall of the chamber 510 including the gateway 512 and relatively proximate (e.g., separated by a second distance, the second distance less than the first distance) to a second sidewall of the chamber 510, the second sidewall positioned close to the exhaust hole 514.

In the example embodiments of FIGS. 8 and 9, a heater (not shown) may be formed at the bottom surface of the chamber 510 and/or within the chamber 510 such that the substrate 560 on the stage 520 may be heated to a given temperature. In an example, the heater may be integrated with the chamber 510.

In the example embodiments of FIGS. 8 and 9, a first gas supplier 522 may penetrate through the bottom portion of the chamber 510 and may extend to a position under the stage 520. A first purge gas may be supplied into a bottom surface of the stage 520 through the first gas supplier 522. In an example, the first purge gas may include an inactive gas such as an inert gas. A non-exhausted set of examples of inert gases may include helium gas, nitrogen gas, argon gas, etc. The inert gases may be employed alone and/or in combination with other inert gases. The first purge gas may reduce a deposition of the source gas (e.g., supplied into the chamber 510) onto the bottom surface of the stage 520.

In the example embodiment of FIGS. 8 and 9, a second gas supplier 524 may penetrate through the bottom portion of the chamber 510 and the stage 520 and may extend to a top surface of the stage 520. A second purge gas may be supplied into a boundary area between the stage 520 and the substrate 560 through the second gas supplier 524. The second purge gas may reduce a deposition of the source gas (e.g., supplied into the chamber 510) onto the top surface of the stage 520 and/or a rear surface of the substrate 560.

In the example embodiment of FIGS. 8 and 9, the edge ring 530 may be positioned along the stepped portion and the peripheral portion of the stage 520. The source gas supplied into the chamber 510 may be guided to the substrate 560 on the stage 520 via the edge ring 530.

In the example embodiment of FIGS. 8 and 9, the shower head 540 may be positioned at an upper portion of the chamber 510 and may face the stage 520 in the chamber 510. In an example, the source gas supplied into the chamber 510 may be uniformly distributed onto the substrate 560 on the stage 520 via the shower head 540.

In the example embodiment of FIGS. 8 and 9, the chamber insert 550 may include a body portion 551, a first protruding portion 552 and a second protruding portion 553. The body portion 551 may include a slit 554 formed at a first side surface of the body portion 551 and a plurality of holes 555 formed at a second side surface of the body portion 551 opposite to the first side surface. In an example, the chamber insert 550 of FIGS. 8 and 9 may be the same as the chamber insert 100 of FIG. 2.

In the example embodiment of FIGS. 8 and 9, the first side surface of the body portion 551 including the slit 554 may be positioned apart from a side surface of the edge ring 530 by a first distance d1, and the second side surface of the body portion 551 including the plurality of holes 555 may be positioned apart from a side surface of the edge ring 530 by a second distance d2, such that the chamber insert 550 may be positioned apart from the stage 520 by the first distance d1 and the second distance d2.

In the example embodiment of FIGS. 8 and 9, a central axis of the chamber insert 550 may be coincident to that of the stage 520 such that the first distance d1 may be substantially the same as the second distance d2 (e.g., as illustrated in FIG. 8). In another example embodiment of the present invention, while not illustrated in FIGS. 8 and 9, a central axis of the chamber insert 550 may not be coincident to that of the stage 520, such that the first distance d1 may be different from that of the second distance d2. The chamber inserter 550 may thereby be eccentrically (e.g., asymmetrically or not centered) positioned apart from the stage 520.

In the example embodiment of FIGS. 8 and 9, a flow uniformity of the first and second purge gases being supplied through the first and second gas suppliers 522 and 524 may be disrupted around the first side surface of the body portion 551 due to the slit 554 and the first distance d1 between the chamber insert 550 and the edge ring 530. The flow disruption may be caused by a larger amount of the first and second purge gases provided onto a top surface of the stage 520 through the slit 554 of the body portion 551 such that the first and second purge gases may have a greater effect on a flow of the source gas around the first side surface of the body portion 551 including the slit 554. The second protruding portion 553 may reduce a flow effect to the source gas around the first side surface of the body portion 551 caused by the first and second purge gases flowing out from the slit 554.

In the example embodiment of FIGS. 8 and 9, the second protruding portion 553 may not be formed on the second side surface of the body portion 551 corresponding to positions at which the plurality of holes 555 (e.g., not the slit 554) may be formed such that a flow rate of gases may be improved in the chamber 510. Accordingly, the interior of the chamber 510 may be maintained into a vacuous state in a reduced time due to the rapid flow rate of the gases. In addition, an inner pressure of the chamber 510, which may be increased by an inflowing processing gas, may be reduced, such that the chamber 510 may reach a lower and more stable vacuum degree in a shorter period of time.

In the example embodiment of FIGS. 8 and 9, the chamber insert 550 may be positioned apart from the first sidewall of the chamber 510 including the gateway 512 by a third distance d3, and the chamber insert 550 may be positioned apart from the second sidewall of the chamber 510 in proximity to the exhaust hole 514 by a fourth distance d4 shorter than the third distance d3. The chamber insert 550 may be relatively close to the chamber 510 in proximity to the exhaust hole 514 and may be positioned further apart from the chamber 510 at the exhaust hole 514. Accordingly, when pumping out or exhausting the residual processing gases and byproducts from the chamber 510 through the exhaust hole 514, the residual processing gases and byproducts around the exhaust hole 514 may be insufficiently (e.g., not substantially) removed from the chamber 510 while the residual processing gases and byproducts far off from the exhaust hole 514 may be sufficiently (e.g., substantially) removed from the chamber 510. As a result, while the exhaust hole 514 may be formed at one side of the bottom portion of the chamber 510, the residual processing gases and byproducts may be pumped out from the chamber 510 uniformly through the space of the chamber 510. In an example, a bottom surface of the chamber insert 550 is positioned on a coplanar surface with the bottom surface of the stage 520.

In the example embodiment of FIGS. 8 and 9, a flow rate of gases may be improved by simplifying a structure of the chamber insert 550 such that an interior pressure of the chamber 510 may be reduced in a shorter period of time. A thin layer may be uniformly formed on the substrate 560 in the apparatus 500 including the chamber insert 550 (e.g., an asymmetrical chamber insert). Further, the processing gas may be reduced (e.g., prevented) from being supplied onto a bottom surface of the stage 520 and the boundary area of the stage 520 and the substrate 560 by the first and second gas suppliers.

Figure 10:
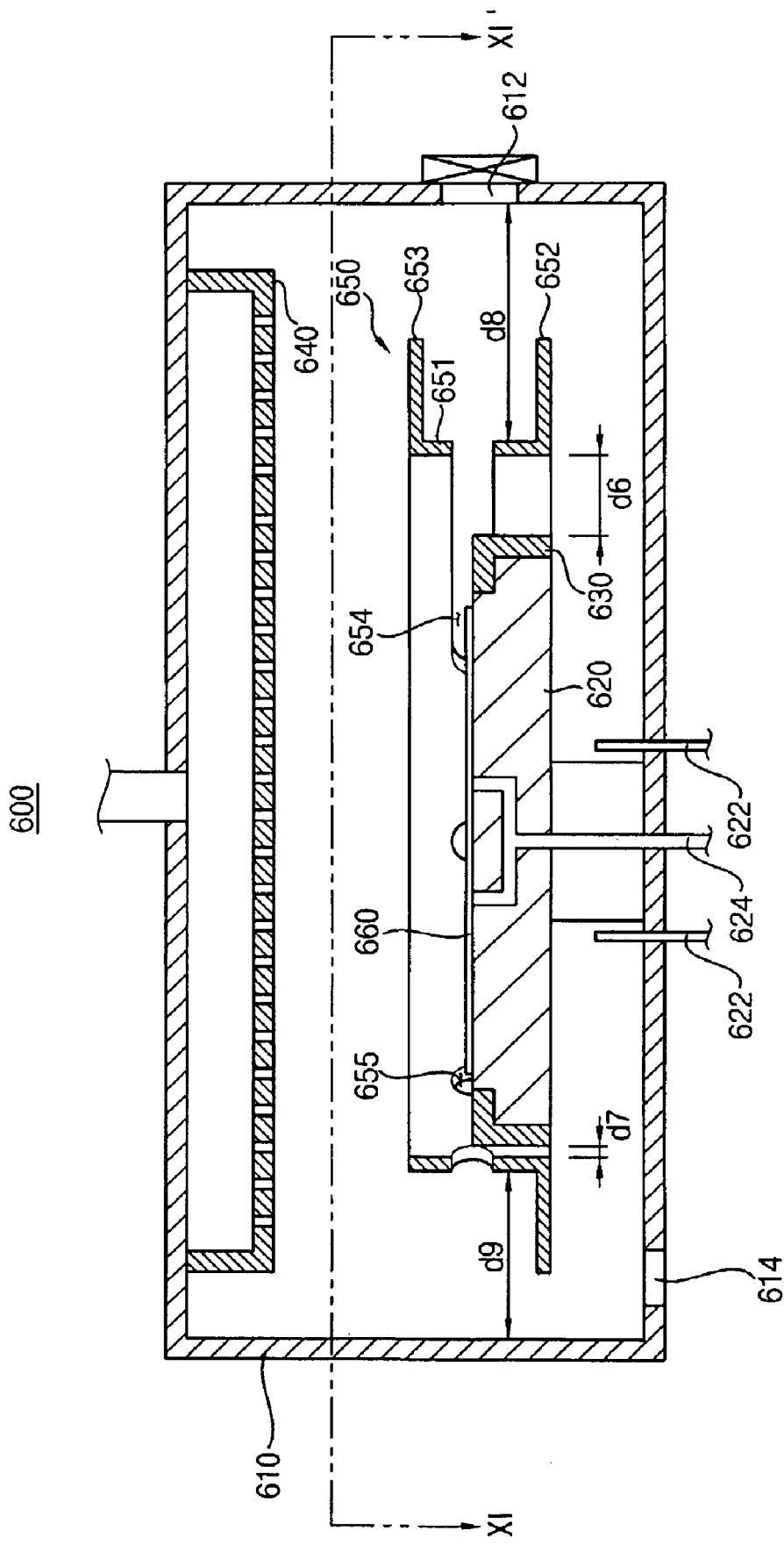
FIG. 10 is a cross sectional view illustrating an apparatus for processing a substrate according to another example embodiment of the present invention.
Figure 11:
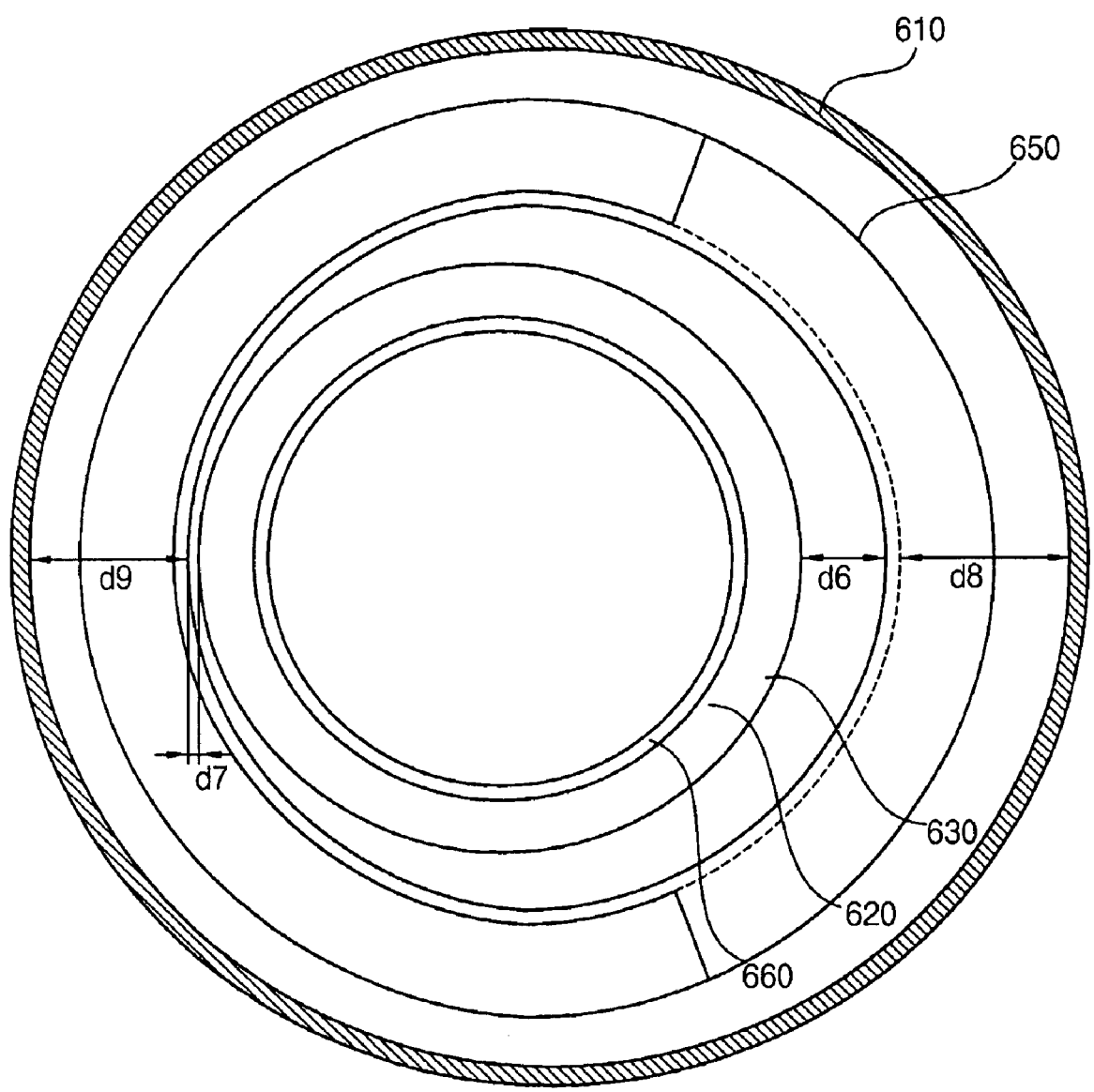
FIG. 11 is a cross sectional view taken along a line XI-XI' of FIG. 10.

FIG. 10 is a cross sectional view illustrating an apparatus 600 for processing a substrate 660 according to another example embodiment of the present invention. FIG. 11 is a cross sectional view taken along a line XI-XI' of FIG. 10.

In the example embodiment of FIGS. 10 and 11, the apparatus 600 may include a chamber 610, a stage 620, an edge ring 630, a shower head 640 and a chamber insert 650. In an example, the chamber 610, the stage 620, the edge ring 630 and the shower head 640 of FIGS. 10 and 11 may correspond to the chamber 510, the stage 520, the edge ring 530 and the shower head 540 of FIGS. 8 and 9. Accordingly, any further detailed descriptions on the chamber 610, the stage 620, the edge ring 630 and the shower head 640 has been omitted for the sake of brevity.

In the example embodiment of FIGS. 10 and 11, the chamber insert 650 may include a body portion 651, a first protruding portion 652 and a second protruding portion 653. The body portion 651 may include a slit 654 formed at a first side surface of the body portion 651 and a plurality of holes 655 formed at a second side surface of the body portion 651 opposite to the first side surface. In an example, the chamber insert 650 of FIGS. 10 and 11 may correspond to the chamber insert 200 of FIG. 6.

In the example embodiment of FIGS. 10 and 11, the first side surface of the body portion 651 including the slit 654 may be positioned apart from a side surface of the edge ring 630 by a first distance d6, and the second side surface of the body portion 651 including the plurality of holes 655 may be positioned apart from a side surface of the edge ring 630 by a second distance d7 (e.g., which may be shorter than the first distance d6).

In the example embodiment of FIGS. 10 and 11, when pumping out or exhausting gases from the chamber 610 through the exhaust hole 614, the gases around the second side surface of the body portion 610 including the plurality of holes 655 may not be entirely removed from the chamber 610 due to the relatively small distance d7, while the gases around the first side surface of the body portion 610 may be sufficiently (e.g., substantially) removed from the chamber 610 due to a relatively large distance d6. Thus, while the exhaust hole 614 may be locally formed at one side of the bottom portion of the chamber 610, the gases may be uniformly pumped out or exhausted around the stage 620 irrespective of the first and second side surfaces of the body portion 610.

In the example embodiment of FIGS. 10 and 11, a flow uniformity of the first and second purge gases being supplied through the first and second gas suppliers 622 and 624 may be disrupted around the first side surface of the body portion 651 due to the slit 654 and the first distance d6 between the chamber insert 650 and the edge ring 630. The disruption may be caused by a larger amount of the first and second purge gases provided onto a top surface of the stage 620 through the slit 654 of the body portion 651 such that the first and second purge gases may have a greater effect on a flow of the source gas around the first side surface of the body portion 651 including the slit 654. The second protruding portion 653 may reduce (e.g., prevent) the first and second purge gases flowing out from the slit 654 from affecting the flow of the source gas around the first side surface of the body portion 651.

In the example embodiment of FIGS. 10 and 11, the second protruding portion 653 may not be formed on the second side surface of the body portion 651 at which the plurality of holes 655 (e.g., not the slit 654) may be formed such that a flow rate of gases may be improved in the chamber 610. Accordingly, the interior of the chamber 610 may be formed so as to have a vacuous state in a shorter period of time due to the rapid flow rate of the gases. In addition, an interior pressure of the chamber 610, which may be increased by an inflowing processing gas, may be reduced, such that the chamber 610 may reach a lower and more stable vacuum degree in a shorter period of time.

In the example embodiment of FIGS. 10 and 11, the chamber insert 650 may be positioned apart from the first sidewall of the chamber 610 including the gateway 612 by a third distance d8, and the chamber insert 650 may be spaced apart from the second sidewall of the chamber 610 in proximity to the exhaust hole 614 by a fourth distance d9 shorter than the third distance d8. The chamber insert 650 may be relatively close to the chamber 610 around the exhaust hole 614 and may be further apart from the chamber 610 at the exhaust hole 614. Accordingly, when pumping out or exhausting the residual processing gases and byproducts from the chamber 610 through the exhaust hole 614, the residual processing gases and byproducts around the exhaust hole 614 may be insufficiently (e.g., not entirely or substantially) removed from the chamber 610 while the residual processing gases and byproducts far off from the exhaust hole 614 may be sufficiently (e.g., substantially) removed from the chamber 610. Thus, while the exhaust hole 614 may be locally formed at one side of the bottom portion of the chamber 610, the residual processing gases and byproducts may be pumped out from the chamber 610 uniformly through the interior of the chamber 610. In an example, a bottom surface of the chamber insert 650 may be positioned on a coplanar surface with the bottom surface of the stage 620.

In the example embodiment of FIGS. 10 and 11, a flow rate of gases may be improved by simplifying a structure of the chamber insert 650 such that an interior pressure of the chamber 610 may be reduced (e.g., to a vacuous state) in a shorter period of time. Further, a thin layer may be uniformly formed on the substrate 660 in the apparatus 600 including the chamber insert 650 (e.g., which may be asymmetrical). Furthermore, the processing gas may be reduced (e.g., prevented) in supply onto a bottom surface of the stage 620 and the boundary area of the stage 620 and the substrate 660 by the first and second gas suppliers.

Figure 12:
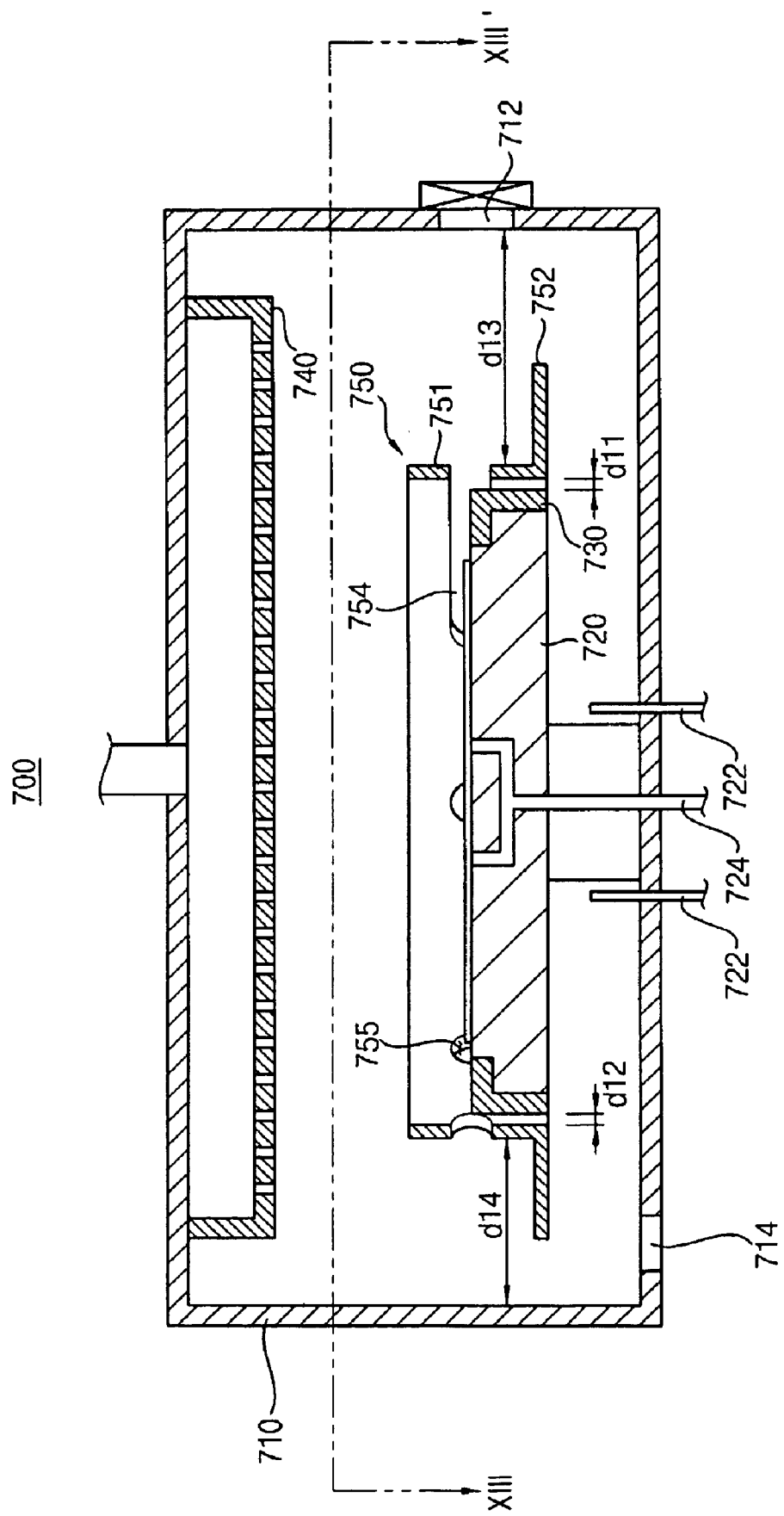
FIG. 12 is a cross sectional view illustrating an apparatus for processing a substrate according to another example embodiment of the present invention.
Figure 13:
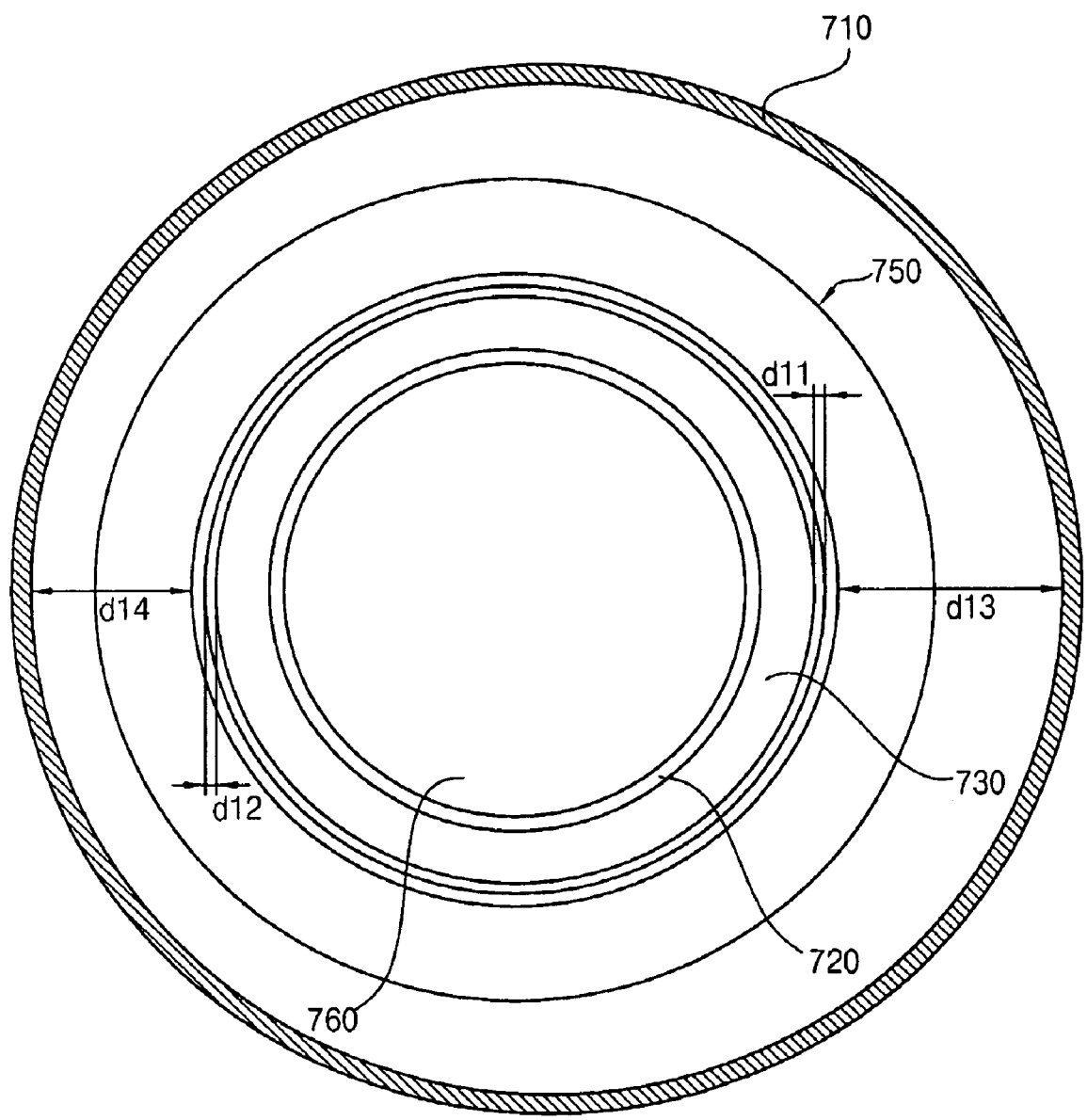
FIG. 13 is a cross sectional view taken along a line XIII-XIII' of FIG. 12.

FIG. 12 is a cross sectional view illustrating an apparatus 700 for processing a substrate 760 according to another example embodiment of the present invention. FIG. 13 is a cross sectional view taken along a line XIII-XIII' of FIG. 12.

In the example embodiment of FIGS. 12 and 13, the apparatus 700 may include a chamber 710, a stage 720, an edge ring 730, a shower head 740 and a chamber insert 750. In an example, the chamber 710, the stage 720, the edge ring 730 and the shower head 740 of FIGS. 12 and 13 may correspond to the chamber 510, the stage 520, the edge ring 530 and the shower head 540 of FIG. 8. Accordingly, further detailed description of the chamber 710, the stage 720, the edge ring 730 and the shower head 740 have been omitted for the sake of brevity.

In the example embodiment of FIGS. 12 and 13, the chamber insert 750 may include a body portion 751, a first protruding portion 752 and a second protruding portion 753. The body portion 751 may include a slit 754 formed at a first side surface of the body portion 751 and a plurality of holes 755 formed at a second side surface of the body portion 751 opposite to the first side surface. In an example, the chamber insert 750 of FIGS. 12 and 13 may correspond to the chamber insert 300 of FIG. 7. Accordingly, a further detailed description of the chamber insert 750 has been omitted for the sake of brevity.

In the example embodiment of FIGS. 12 and 13, if the body portion 751 of the chamber insert 750 has a single radius, a configuration of the chamber insert 750 and the stage 720 may correspond to the chamber insert 550 and the stage 520, respectively, as described above with respect to FIG. 8.

In the example embodiment of FIGS. 12 and 13, if the body portion 751 of the chamber insert 750 includes a plurality of radiuses (e.g., the body portion 751 may be "warped" or non-uniform), a configuration of the chamber insert 750 and the stage 720 may correspond to the chamber insert 650 and the stage 620, respectively, as above described with respect to FIG. 10.

In the example embodiment of FIGS. 12 and 13, a flow rate of gases may be improved by simplifying a structure of the chamber insert 750 such that an interior pressure of the chamber 710 may be reduced (e.g., to a vacuous state) in a shorter period of time. Further, a thin layer may be uniformly formed on the substrate 760 in the substrate processing apparatus 700 including the chamber insert 750 (e.g., which may be asymmetrical). Furthermore, the processing gas may be reduced (e.g., prevented) in supply onto a bottom surface of the stage 720 and the boundary area of the stage 720 and the substrate 760 by the first and second gas suppliers.

Hereinafter, experiments employing a chamber insert in accordance with both conventional methodologies and example embodiments of the present invention will be described with respect to FIGS. 14-35 and Table 1 (below). It is understood that any experiment includes numerous determinations of a variety of factors and conditions. While the experiments described below are given with sufficient specificity so as for one of ordinary skill in the art to recreate the respective experiments, it is understood that any number of criteria for the experiments may have adjusted as necessary for other experiments.

A thin layer was formed on a wafer having a size of about 300 nm in a processing chamber including a gateway and an exhaust hole formed with a deposition process on side surfaces thereof and facing each other. In the deposition process, methylpyrrolidine alane (MPA) gas at a quantity approximating 21 sccm was provided into the processing chamber as a source gas with argon (Ar) gas at a quantity approximating 400 sccm as a carrier gas at a temperature of about 130° C. and under a pressure of about 3 Torr in the processing chamber. Argon gas at a quantity approximating 1,000 sccm was also supplied to a boundary area between the stage and the substrate as the second purge gas.

A deposition rate at a peripheral portion of the wafer and a partial pressure of the MPA gas at the lower portion of the stage were measured at various chamber insert shapes and flow rates of argon (Ar) gas as the first purge gas, as listed below in Table 1.

TABLE 1

|  | Shape of the Chamber Insert | Diameter of the Chamber Insert (inches) | Flow Rate of the First Purge Gas (sccm) |
|---|---|---|---|
| 1st Specimen | Inner and outer shields and conventional chamber insert | 14.7 | 1,000 |
| 2nd Specimen | Conventional chamber insert | 14.7 | 5,000 |
| 3rd Specimen | Conventional chamber insert | 13.87 | 1,000 |
| 4th Specimen | First and second protruding portions | 13.87 | 1,000 |
| 5th Specimen | First and second protruding portions and a plurality holes | 14.825 | 1,000 |
| 6th Specimen | First and second protruding portions | 13.87 | 1,000 |
| 7th Specimen | First and second protruding portions | 14.285/13.87 | 1,000 |
| 8th Specimen | First and second protruding portions | 14.5/13.87 | 1,000 |
| 9th Specimen | Lower protruding portion | 13.87 | 5,000 |
| 10th Specimen | Lower protruding portion | 13.87 | 3,000 |
| 11th Specimen | Lower protruding portion | 14.285 | 1,000 |

The deposition rate R of the MPA gas onto the peripheral portion of the wafer was calculated based on $$R = CP_{MPA}^a \exp(-E/kT) \quad \text{Equation 1}$$

where C may denote a constant value, $P_{MPA}$ may denote a partial pressure of the MPA gas, 'a' may denote an exponential constant, E may denote an activation energy of the MPA gas, T may denote a temperature of the wafer expressed in Kelvin (K) and 'k' may denote an entropy of the MPA gas.

FIGS. 14 to 35 are views illustrating a deposition rate at the peripheral portion of the wafer and a partial pressure of the MPA gas at the lower portion of the stage in accordance with each specimen listed in Table 1. Accordingly, the 1st Specimen of Table 1 corresponds to the deposition rate illustrated in FIGS. 14 and 15, the 2nd Specimen of Table 1 corresponds to the deposition rate illustrated in FIGS. 16 and 17, and so on. In FIGS. 14 to 35, the partial pressure of the MPA gas may be expressed as a contour line.

Figure 14:
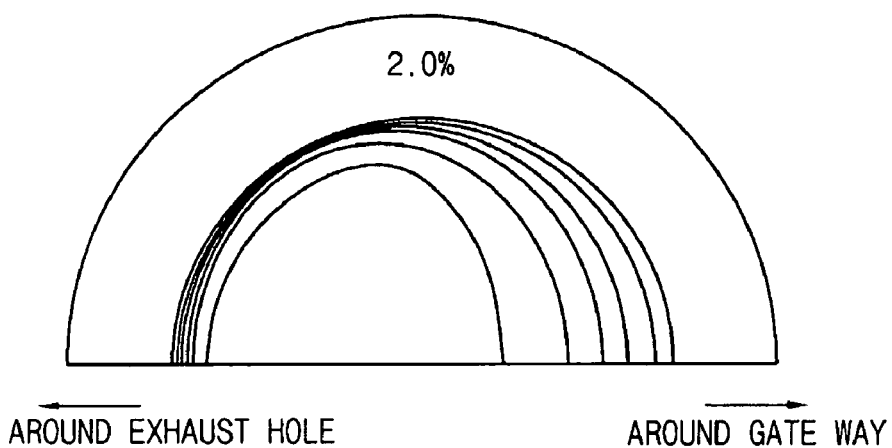
FIGS. 14 to 35 are views illustrating a deposition rate at a peripheral portion of a wafer and a partial pressure of the methylpyrrolidine alane (MPA) gas at a lower portion of a stage in accordance a plurality of experiments.
Figure 15:
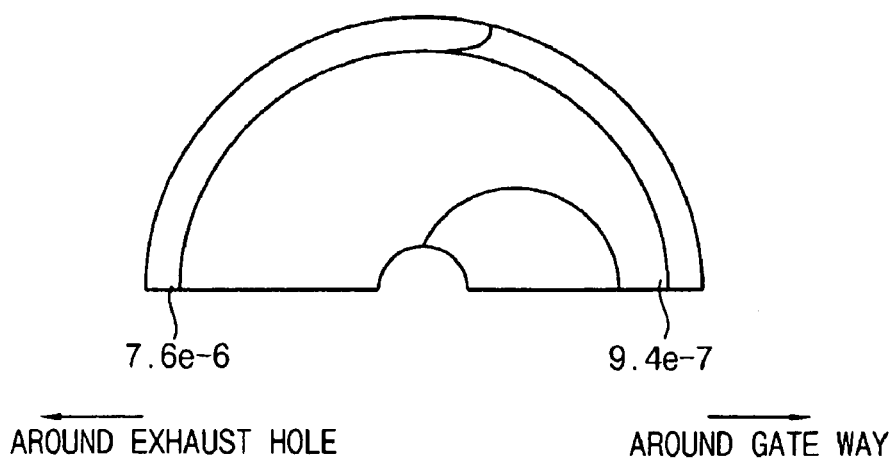

Referring to FIGS. 14 and 15, a first experiment was performed on the 1st specimen in a deposition system including a conventional chamber insert having a radius of about 14.7 inches and inner and outer shields. Argon (Ar) gas at a quantity approximating 1,000 sccm was supplied to the processing chamber as a first purge gas, thereby forming the thin layer on the 1st specimen. Referring to FIGS. 14 and 15, the deposition rate of the MPA gas was about 2.0%, and the partial pressure was about 7.6e-6 around the exhaust hole of the processing chamber and was about 9.4e-7 around the gateway of the processing chamber.

Figure 16:
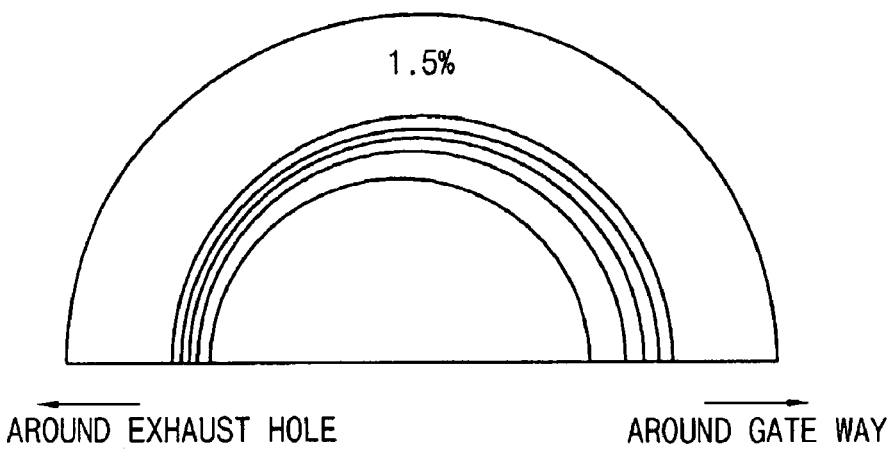
Figure 17:
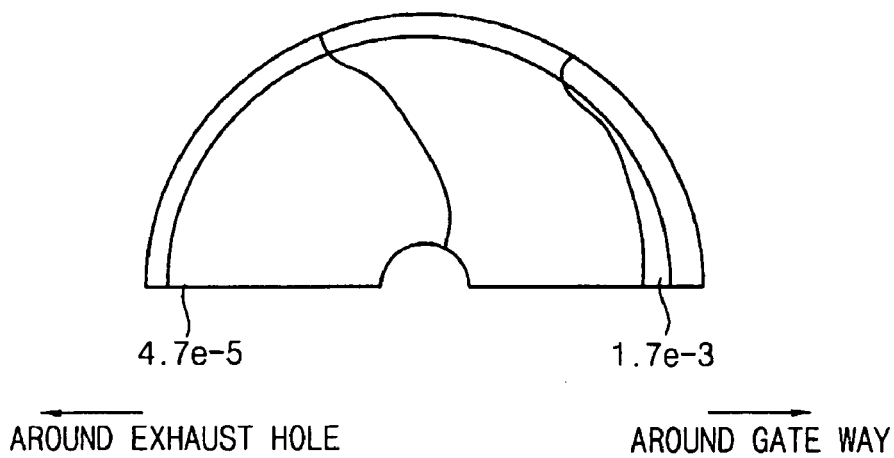

Referring to FIGS. 16 and 17, a second experiment was performed on the 2nd specimen in a deposition system including a conventional chamber insert having a radius of about 14.7 inches without inner and outer shields. Argon (Ar) gas at a quantity approximating 5,000 sccm was supplied to the processing chamber as a first purge gas, thereby forming the thin layer on the 2nd specimen. Referring to FIGS. 16 and 17, the deposition rate of the MPA gas was about 1.5% and the partial pressure was about 4.7e-5 around the exhaust hole of the processing chamber and was about 1.7e-3 around the gateway of the processing chamber. The deposition rate of the MPA gas was improved and the partial pressure of the MPA gas was increased as compared with the first experiment, because the stage and the chamber insert were spaced further apart from each other as compared to the first experiment.

Figure 18:
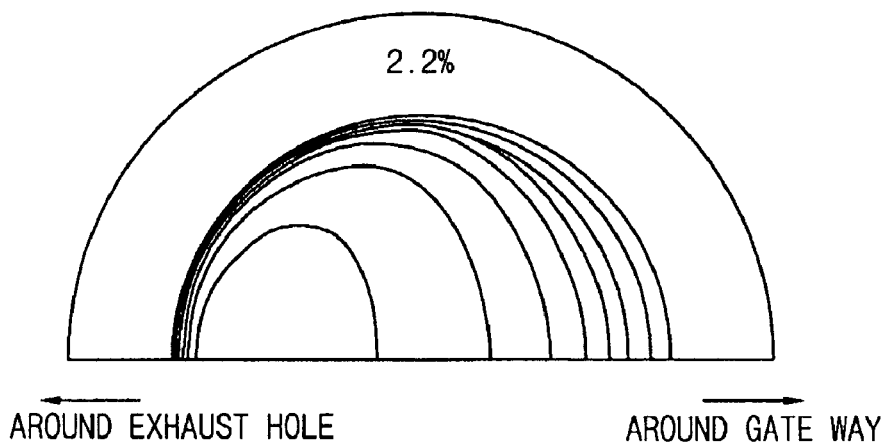
Figure 19:
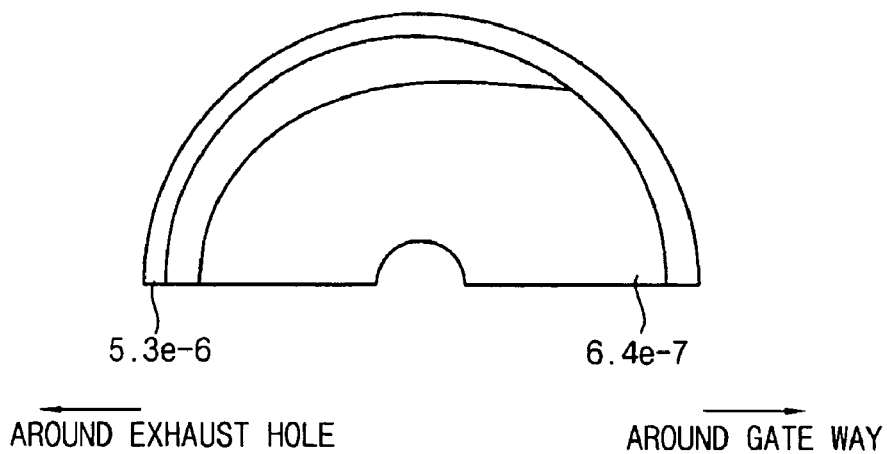

Referring to FIGS. 18 and 19, a third experiment was performed on the 3rd specimen in a deposition system including a conventional chamber insert having a radius of about 13.87 inches without inner and outer shields. Argon (Ar) gas at a quantity approximating 1,000 sccm was supplied to the processing chamber as a first purge gas, thereby forming the thin layer on the 3rd specimen. Referring to FIGS. 18 and 19, the deposition rate of the MPA gas was about 2.2% and the partial pressure was about 5.3e-6 around the exhaust hole of the processing chamber and was about 6.4e-7 around the gateway of the processing chamber. As compared with the second experiment, the deposition rate of the MPA gas was deteriorated and the partial pressure of the MPA gas was also decreased.

Figure 20:
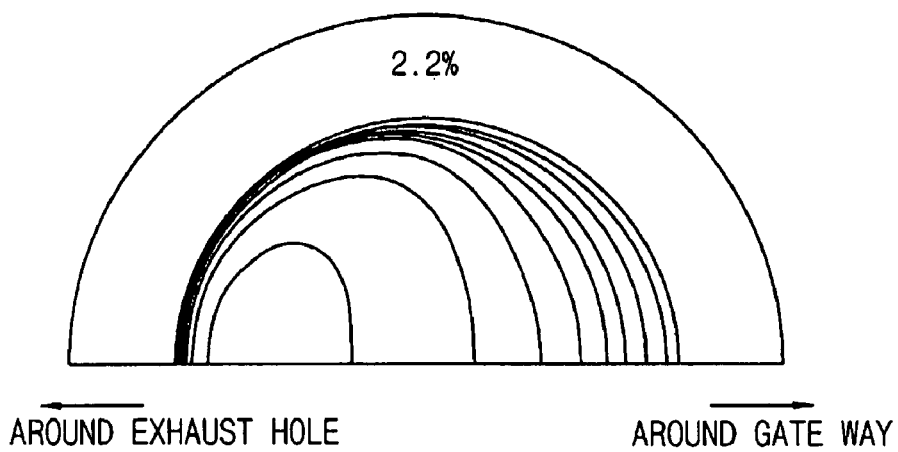
Figure 21:
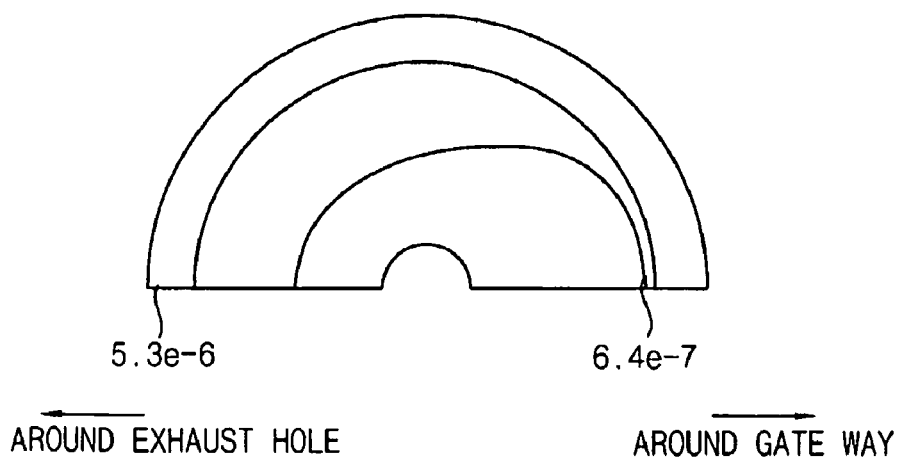

Referring to FIGS. 20 and 21, a fourth experiment was performed on the 4th specimen in a deposition system including a chamber insert of which a radius of a body portion is about 13.87 inches and first and second protruding portions. Argon (Ar) gas of about 1,000 sccm was supplied to the processing chamber as a first purge gas, thereby forming the thin layer on the 4th specimen. The body portion included first and second protruding portions on a side surface thereof. The first protruding portion extended from a lower portion of the body portion along a whole edge line thereof and a second protruding portion extended from an upper portion of the body portion along an edge line corresponding to the gateway. Referring to FIGS. 20 and 21, the deposition rate of the MPA gas was about 2.2% and the partial pressure was about 5.3e-6 around the exhaust hole of the processing chamber and was about 6.4e-7 around the gateway of the processing chamber. The deposition rate and the partial pressure of the MPA gas in the fourth experiment were similar to those of the third experimental results.

Figure 22:
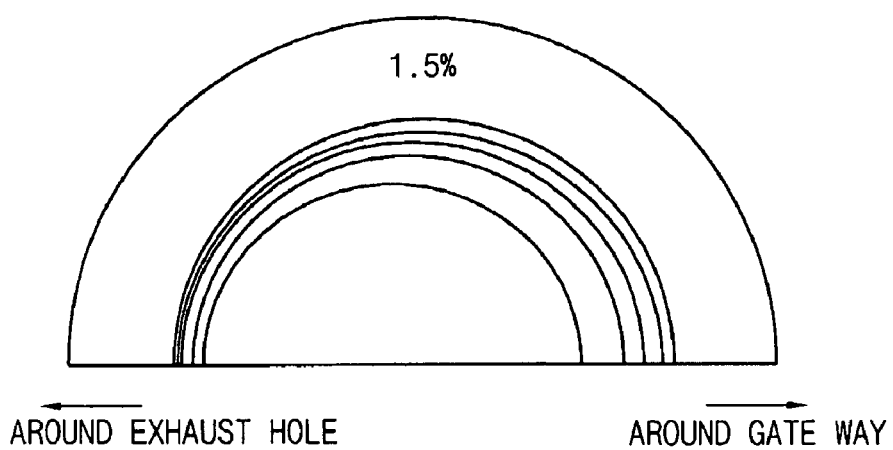
Figure 23:
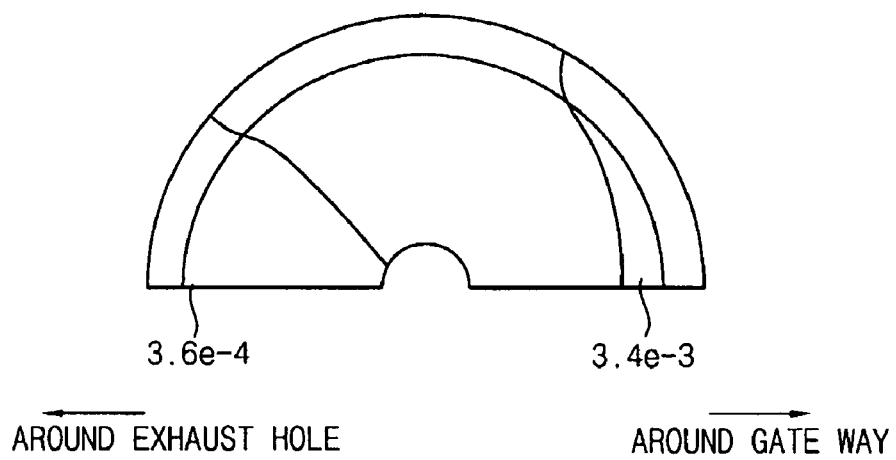

Referring to FIGS. 22 and 23, a fifth experiment was performed on the 5th specimen in a deposition system including a chamber insert of which a radius of a body portion is about 14.285 inches. Argon (Ar) gas at a quantity approximating 1,000 sccm was supplied to the processing chamber as a first purge gas, thereby forming the thin layer on the 5th specimen. The body portion included first and second protruding portions on a side surface thereof. The first protruding portion extended from a lower portion of the body portion along a whole edge line thereof and a second protruding portion extends from an upper portion of the body portion along an edge line corresponding to the gateway. The fifth experiment was performed in a deposition system substantially identical to the deposition system for the fourth experiment except for the radius of the chamber insert. Referring to FIGS. 22 and 23, the deposition rate of the MPA gas was about 1.5% and the partial pressure was about 3.6e-4 around the exhaust hole of the processing chamber and was about 3.4e-3 around the gateway of the processing chamber. Accordingly, the deposition rate was improved and the partial pressure of the MPA gas was decreased as compared with the fourth experimental results. Further, the deposition rate and the partial pressure of the MPA gas appeared similar to the second experimental results. The fifth experimental results appeared to indicate that the chamber insert configuration of the fifth experiment is more favorable to a gas flow in the deposition system than the conventional chamber insert.

Figure 24:
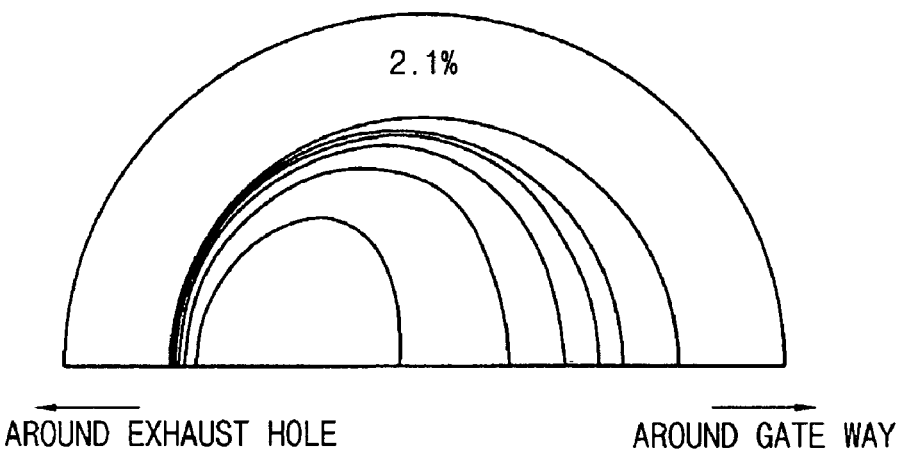
Figure 25:
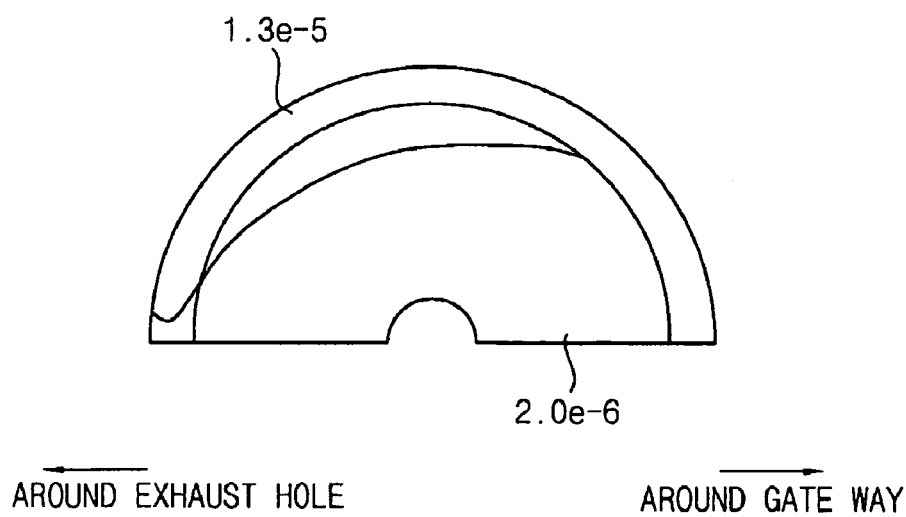

Referring to FIGS. 24 and 25, a sixth experiment was performed on the 6th specimen in a deposition system including a chamber insert of which a radius of a body portion is about 13.87 inches. Argon (Ar) gas at a quantity approximating 1,000 sccm was supplied to the processing chamber as a first purge gas, thereby forming the thin layer on the 6th specimen. The chamber insert for the sixth experiment included first and second protruding portions and a plurality of holes on a body portion thereof. The first protruding portion extended from a lower portion of the body portion along a whole edge line thereof and a second protruding portion extended from an upper portion of the body portion along an edge line corresponding to the gateway. The plurality of holes were formed on the side surface of the body portion in relatively close proximity to the exhaust hole (e.g., as compared to the gateway). Thus, the sixth experiment was performed in a deposition system substantially identical to the deposition system for the fourth experiment except for the holes on the side surface of the body portion. Referring to FIGS. 24 and 25, the deposition rate of the MPA gas was about 2.1% and the partial pressure was about 1.3e-5 around the exhaust hole of the processing chamber and was about 2.0e-6 around the gateway of the processing chamber. Accordingly, the deposition rate was improved and the partial pressure of the MPA gas was decreased as compared with the fourth experimental results. The sixth experimental results appeared to indicate that the plurality of holes on the body portion of the chamber insert at least partially prevent the first purge gas from flowing non-uniformly around the gateway of the chamber, thereby improving the deposition rate.

Figure 26:
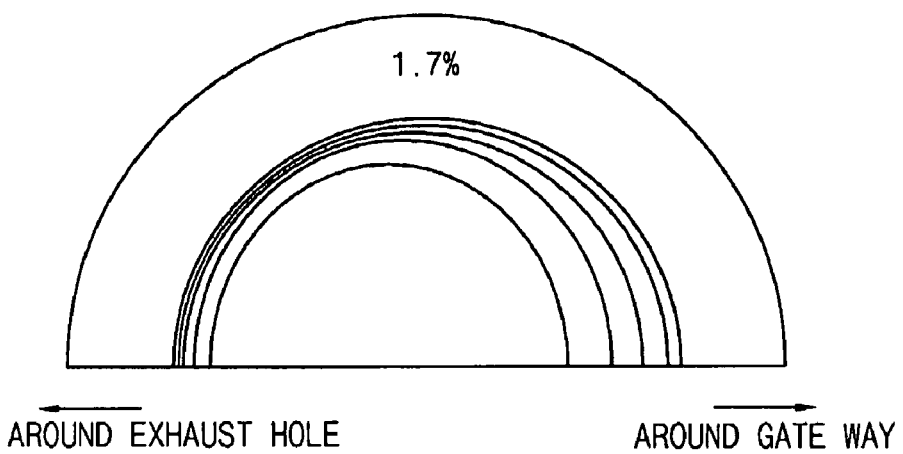
Figure 27:
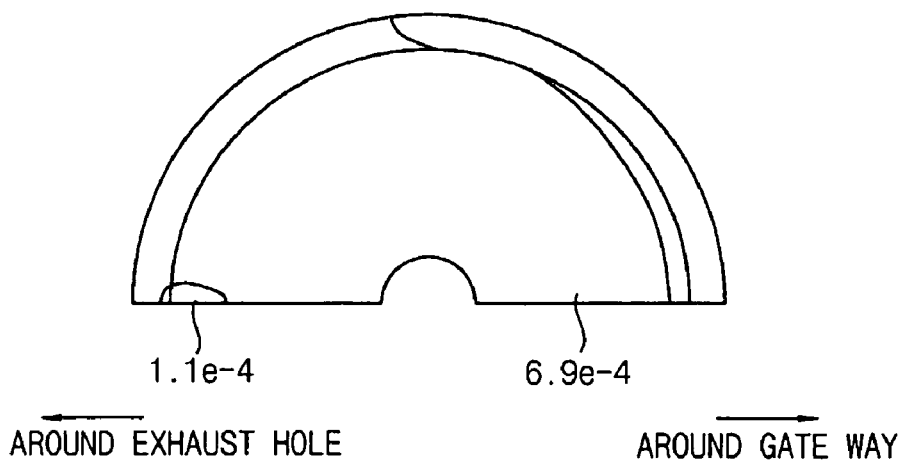

Referring to FIGS. 26 and 27, a seventh experiment was performed on the 7th specimen in a deposition system including a chamber insert having a body portion of with a varying radius. Argon (Ar) gas at a quantity approximating 1,000 sccm was supplied to the processing chamber as a first purge gas, thereby forming the thin layer on the 7th specimen.

Referring to the seventh experiment of FIGS. 26 and 27, the body portion had a first radius of about 14.285 inches around the exhaust hole and a second radius of about 13.87 inches around the gateway, and also had first and second protruding portions positioned on a side surface of the body portion. The first protruding portion extended from a lower portion of the body portion along a whole edge line thereof and a second protruding portion extended from an upper portion of the body portion along an edge line corresponding to the gateway. Thus, the seventh experiment was performed in a deposition system substantially identical to the deposition system for fourth experiment except that the radius of the body portion varied in different positions. Referring to FIGS. 26 and 27, the deposition rate of the MPA gas was about 1.7% and the partial pressure was about 1.1e-4 around the exhaust hole of the processing chamber and was about 6.9e-4 around the gateway of the processing chamber. The experimental results of the seventh experiment appear to indicate that the deposition rate was improved and the partial pressure of the MPA gas was decreased as compared with the fourth experimental results.

Figure 28:
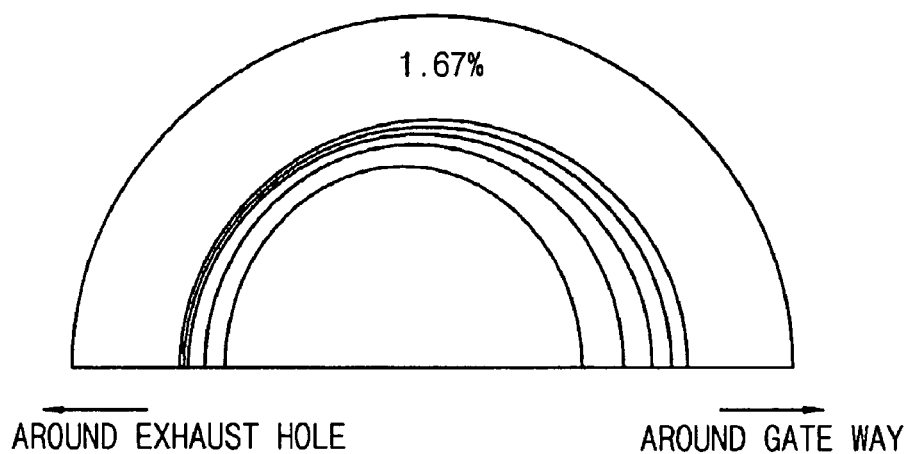
Figure 29:
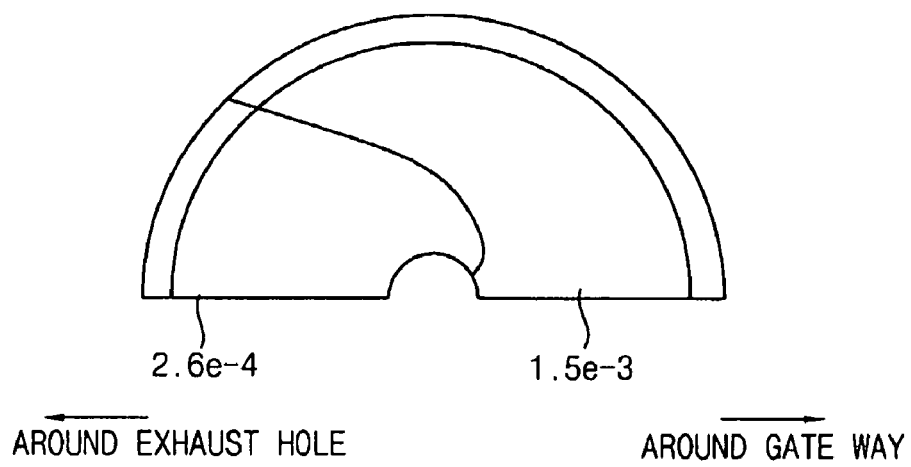

Referring to FIGS. 28 and 29, an eighth experiment was performed on the 8th specimen in a deposition system including a chamber insert having a body portion with a non-uniform radius. Argon (Ar) gas at a quantity approximating 1,000 sccm was supplied to the processing chamber as a first purge gas, thereby forming the thin layer on the 8th specimen.

Referring to the eighth experiment of FIGS. 28 and 29, the body portion had a first radius of about 14.5 inches around the exhaust hole and a second radius of about 13.87 inches around the gateway, and also had first and second protruding portions on a side surface of the body portion. The first protruding portion extended from a lower portion of the body portion along a whole edge line thereof and a second protruding portion extended from an upper portion of the body portion along an edge line corresponding to the gateway. Thus, the eighth experiment was performed in a deposition system substantially identical to the deposition system of the fourth experiment except that the radius of the body portion was varied or non-uniform. Referring to FIGS. 28 and 29, the deposition rate of the MPA gas was about 1.67% and the partial pressure was about 2.6e-4 around the exhaust hole of the processing chamber and was about 1.5e-3 around the gateway of the processing chamber. The experimental results of the eighth experiment appear to indicate that the deposition rate was improved and the partial pressure of the MPA gas was decreased as compared with the fourth experimental results. However, the partial pressure of the MPA gas was increased as compared with the results of the seventh experiment.

Figure 30:
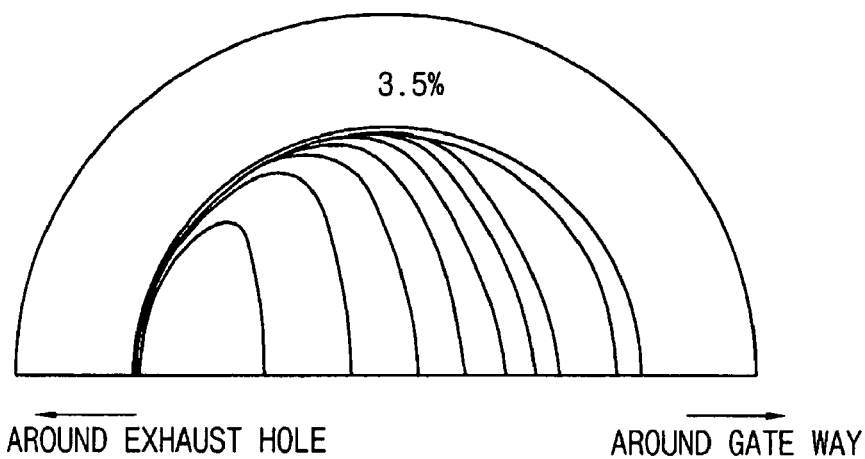
Figure 31:
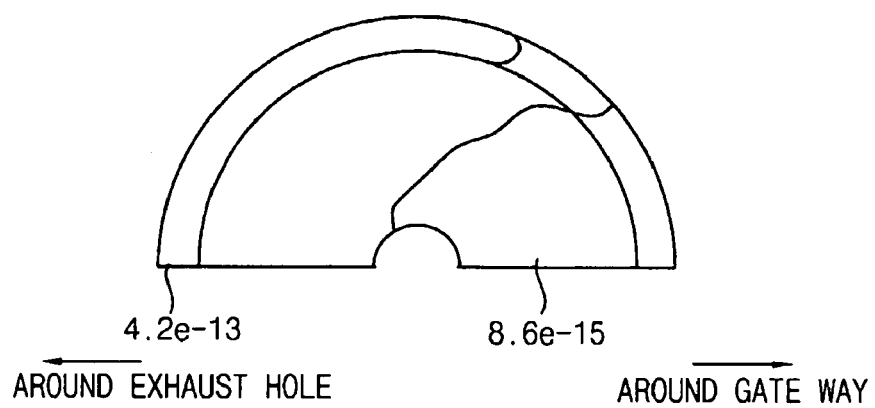

Referring to FIGS. 30 and 31, a ninth experiment was performed on the 9th specimen in a deposition system including a chamber insert of which a radius of a body portion is about 13.87 inches. Argon (Ar) gas at a quantity approximating 5,000 sccm was supplied to the processing chamber as a first purge gas, thereby forming the thin layer on the 9th specimen. The body portion had a protruding portion on a side surface thereof. The protruding portion extended from a lower portion of the body portion along a whole edge line thereof. Referring to FIGS. 30 and 31, the deposition rate of the MPA gas was about 3.5% and the partial pressure was about 4.2e-13 around the exhaust hole of the processing chamber and was about 8.6e-15 around the gateway of the processing chamber. The experimental results of the eighth experiment appear to indicate that the deposition rate was deteriorated and the partial pressure of the MPA gas was decreased as compared with the results of the third experiment.

Figure 32:
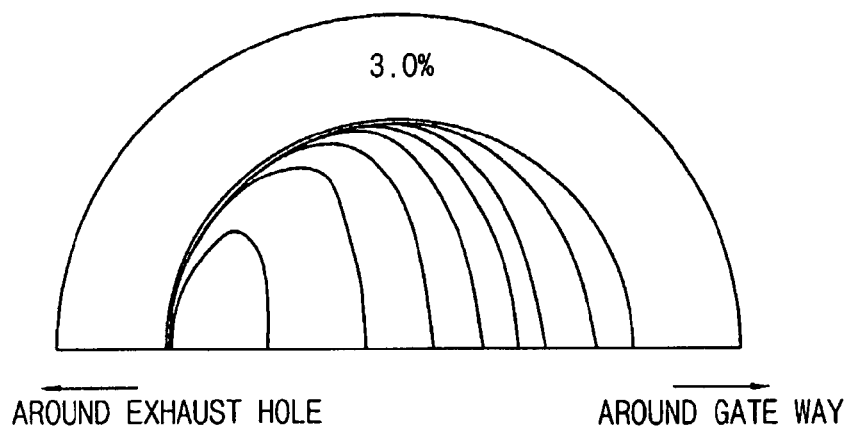
Figure 33:
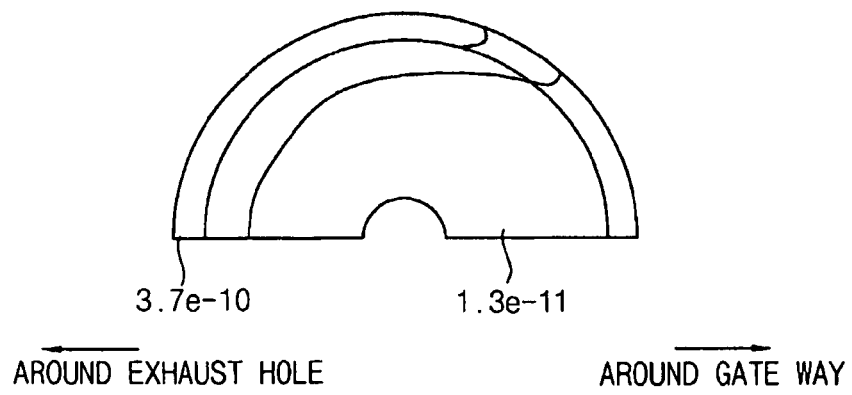

Referring to FIGS. 32 and 33, a tenth experiment was performed on the 10th specimen in a deposition system including a chamber insert of which a radius of a body portion is about 13.87 inches. Argon (Ar) gas at a quantity approximating 3,000 sccm was supplied to the processing chamber as a first purge gas, thereby forming the thin layer on the 10th specimen. The body portion had a protruding portion on a side surface thereof. The protruding portion extended from a lower portion of the body portion along a whole edge line thereof. Thus, the tenth experiment was performed in a deposition system substantially identical to the deposition system of the ninth experiment except for the flow rate of the first purge gas. Referring to FIGS. 32 and 33, the deposition rate of the MPA gas was about 3.0% and the partial pressure was about 3.7e-10 around the exhaust hole of the processing chamber and was about 1.3e-11 around the gateway of the processing chamber. Thus, the deposition rate appeared to be somewhat improved as compared with the ninth experimental results. However, the tenth experimental results appeared to be less satisfactory as compared to the second experimental results. In addition, the partial pressure of the MPA gas was somewhat increased as compared with the ninth experimental results.

Figure 34:
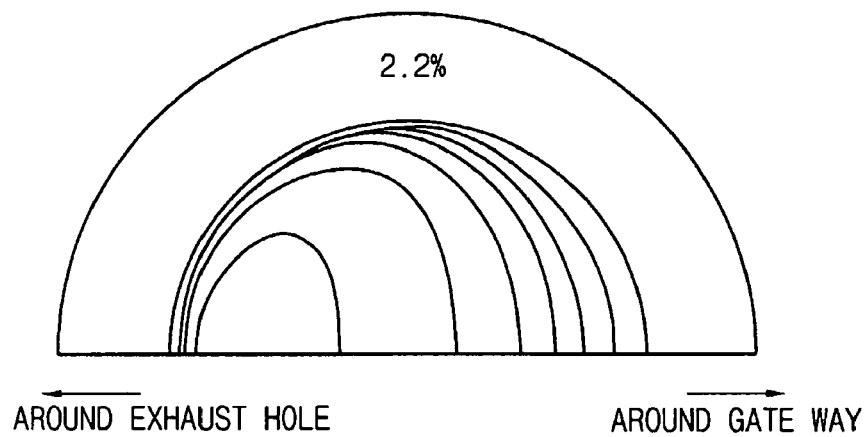
Figure 35:
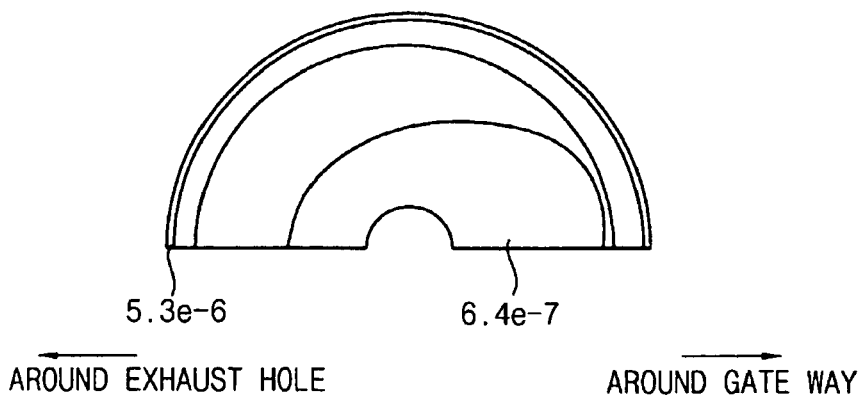

Referring to FIGS. 34 and 35, an eleventh experiment was performed on the 11th specimen in a deposition system including a chamber insert of which a radius of a body portion is about 14.285 inches. Argon (Ar) gas at a quantity approximating 1,000 sccm was supplied to the processing chamber as a first purge gas, thereby forming the thin layer on the 11th specimen. The body portion had a protruding portion on a side surface thereof. The protruding portion extended from a lower portion of the body portion along a whole edge line thereof. Referring to FIGS. 34 and 35, the deposition rate of the MPA gas was about 2.2% and the partial pressure was about 5.3e-6 around the exhaust hole of the processing chamber and was about 6.4e-7 around the gateway of the processing chamber. Thus, the deposition rate appeared to be somewhat improved as compared with the tenth experimental results, while less satisfactory as compared with the second experimental results. In addition, the partial pressure of the MPA gas was somewhat increased as compared with the ninth experimental results.

Figure 36:
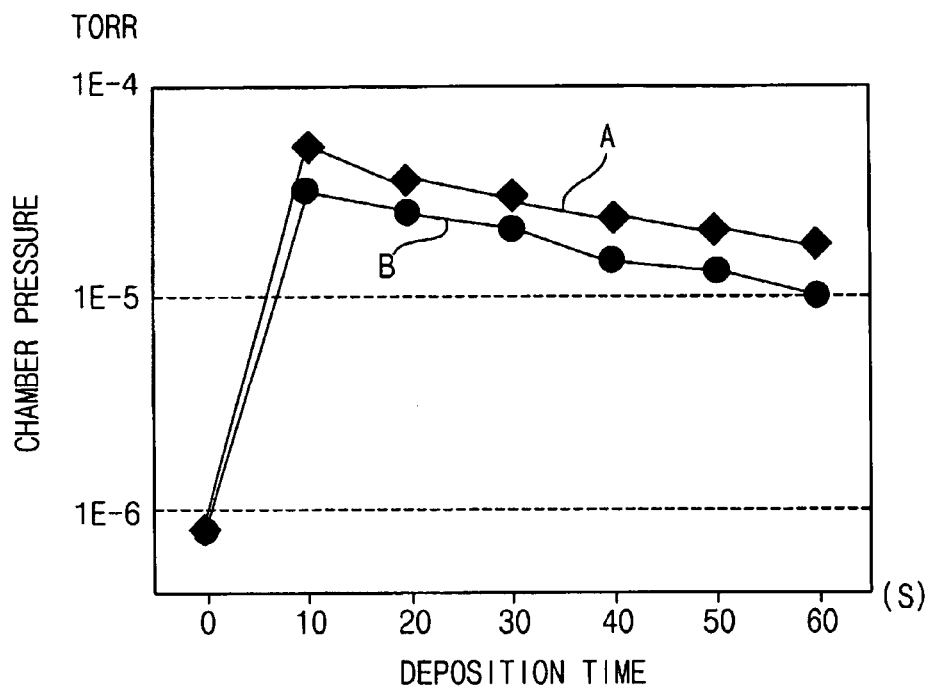
FIG. 36 is a diagram illustrating a pressure variation in a chemical vapor deposition (CVD) process for forming an aluminum layer on a wafer according to another example embodiment of the present invention.

FIG. 36 is a diagram illustrating a pressure variation in a chemical vapor deposition (CVD) process for forming an aluminum layer on a wafer according to another example embodiment of the present invention. In the example embodiment of FIG. 36, Graph A may denote a pressure variation in a deposition system including a conventional chamber insert 10 of FIG. 1 and Graph B may denote a pressure variation in a deposition system including the chamber insert 100 of FIGS. 2 to 5.

In the example embodiment of FIG. 36, Graph B may generally be positioned "under", or at lower levels, than Graph A. Thus, an internal pressure of the processing chamber including the chamber insert 100 of FIGS. 2 to 5 may be lower than that of the processing chamber including the conventional chamber insert 10 of FIG. 1. FIG. 36 may also indicate that a vacuum degree of the processing chamber of the chamber insert 100 of FIGS. 2 to 5 may be superior to the conventional chamber insert 10 of FIG. 1 when the residual source gases and byproducts are pumped out or exhausted from the processing chamber after the aluminum thin layer may be formed on the wafer (e.g., by a CVD process).

Figure 37:
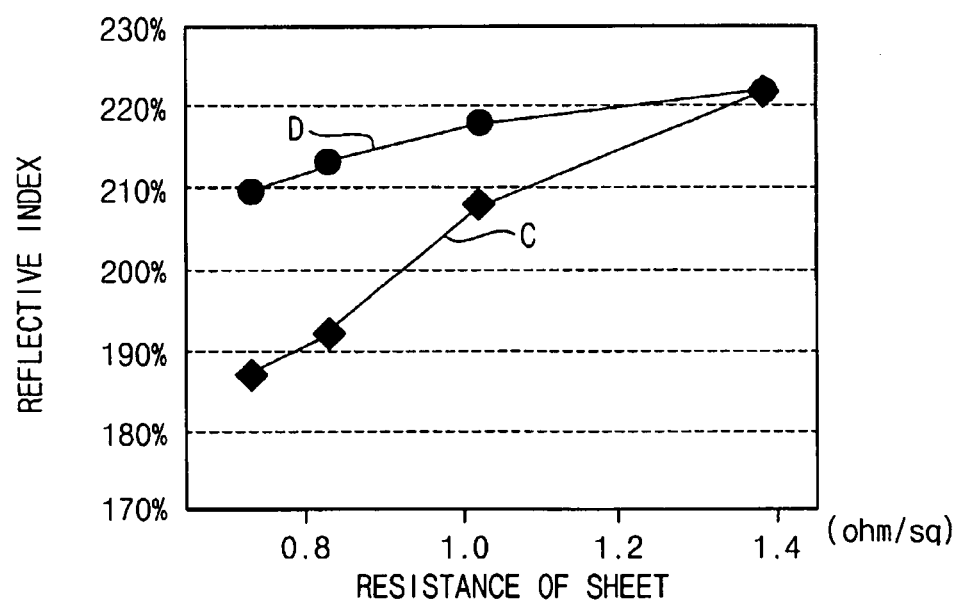
FIG. 37 is a diagram illustrating a correlation of a reflective index (RI) of an aluminum layer formed by a CVD process with respect to a sheet resistance of a titanium layer when the titanium layer is formed to a thickness of about 300 Å according to another example embodiment of the present invention.

FIG. 37 is a diagram illustrating a correlation of a reflective index (RI) of an aluminum layer formed by a CVD process with respect to a sheet resistance of a titanium layer when the titanium layer is formed to a thickness of about 300 Å according to another example embodiment of the present invention.

Figure 38:
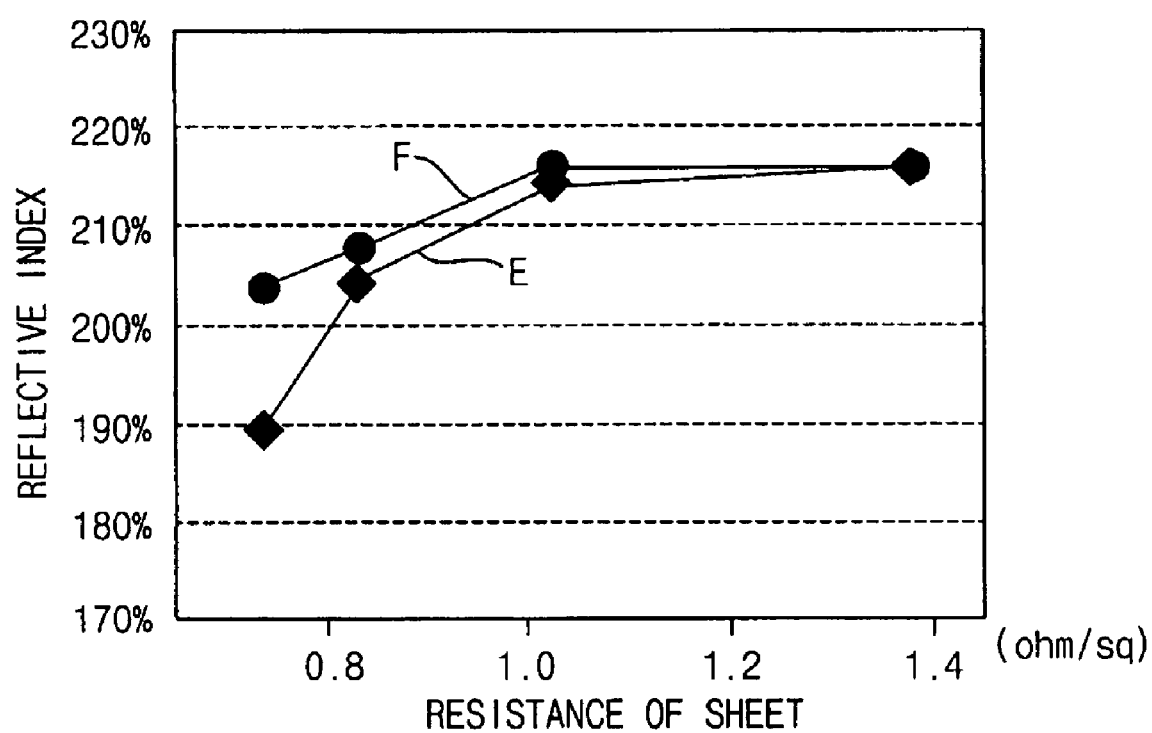
FIG. 38 is a diagram illustrating a correlation of a reflective index (RI) of an aluminum layer formed by a CVD process with respect to a sheet resistance of a titanium layer when the titanium layer is formed to a thickness of about 500 Å according to another example embodiment of the present invention.

FIG. 38 is a diagram illustrating a correlation of a reflective index (RI) of an aluminum layer formed by a CVD process with respect to a sheet resistance of a titanium layer when the titanium layer is formed to a thickness of about 500 Å according to another example embodiment of the present invention.

In the example embodiments of FIGS. 37 and 38, Graph C and Graph E may denote a correlation of the RI of the aluminum layer and the sheet resistance of the titanium layer when the aluminum layer is formed in a deposition system including a conventional chamber insert (e.g., chamber insert 10 of FIG. 1), and Graph D and Graph F may denote a correlation of the RI of the aluminum layer and the sheet resistance of the titanium layer when the aluminum layer is formed in a deposition system including the chamber insert 10 of FIGS. 2 to 5. A review of FIGS. 37 and 38 reveals that the chamber insert 100 of FIGS. 2 to 5 may have superior RI characteristics as compared to the conventional chamber insert (e.g., chamber insert 10 of FIG. 1).

In the example embodiment of FIG. 37, if the aluminum layer is formed on the titanium layer having a thickness of about 300 Å and a sheet resistance of about 1.0 ohm/sq to a thickness of about 400 Å by a CVD process, Graph C may illustrate that the RI of the aluminum layer may be about 207% if the processing chamber for the CVD process includes the conventional chamber insert (e.g., chamber insert 10 of FIG. 1) while Graph D may illustrate that the RI of the aluminum layer may be about 218% if the processing chamber for the CVD process includes a chamber insert (e.g., chamber insert 100 of FIGS. 2 to 5) according to an example embodiment of the present invention.

In the example embodiment of FIG. 38, if the aluminum layer is formed on the titanium layer having a thickness of about 500 Å and a sheet resistance of about 1.0 ohm/sq to a thickness of about 400 Å by a CVD process, Graph E may illustrate that the RI of the aluminum layer may be about 209% if the processing chamber for the CVD process includes the conventional chamber insert (e.g., chamber insert 10 of FIG. 1) while Graph D may illustrate that the RI of the aluminum layer may be about 217% if the processing chamber for the CVD process includes a chamber insert (e.g., chamber insert 100 of FIGS. 2 to 5) according to an example embodiment of the present invention.

In another example embodiment of the present invention, a chamber insert (e.g., chamber insert 100 of FIGS. 2 to 5, chamber insert 200 of FIG. 6, etc.) may have a simplified structure and a higher pumping efficiency as compared to conventional chamber insert (e.g., chamber insert 10 of FIG. 1) such that residual processing gases and byproducts may be pumped out from a chamber in a shorter period of time without significantly disturbing a gas flow uniformity in the chamber. Further, the chamber insert according to an example embodiment of the present invention may have an asymmetrical configuration, such that an amount of processing gas deposited onto a rear surface of a stage may be reduced. A thin layer may be more uniformly formed on a wafer in a processing chamber including the above-described example chamber insert.

Example embodiments of the present invention being thus described, it will be obvious that the same may be varied in many ways. For example, while the above-described example embodiments of the present invention are directed generally to chamber inserts including a plurality of "circular" holes, it is understood that other example embodiments of the present invention need not include circular holes, and any type of hole or gap may be used to vent gases in positions other than the slit.

Such variations are not to be regarded as departure from the spirit and scope of example embodiments of the present invention, and all such modifications as would be obvious to one skilled in the art are intended to be included within the scope of the following claims.

What is claimed is:
1. An apparatus for processing a substrate, comprising:
a chamber including the substrate to be processed with a received source gas, the chamber including a gateway through which the substrate passes and an exhaust hole through which inner gases are exhausted;
a stage on which the substrate is positioned in the chamber; and
a chamber insert including,
a cylindrical body portion including an open top end portion and an open bottom end portion, the cylindrical body portion including a slit and at least one hole, the slit and the at least one hole positioned circumferentially along the cylindrical body portion,
a first protruding portion extending outwardly from a first portion of the cylindrical body portion; and
a second protruding portion extending outwardly from a second portion of the cylindrical body portion,
wherein the slit is positioned at a side surface of the cylindrical body portion so as to circumferentially correspond to the second protruding portion, and the at least one hole is formed in a position along the cylindrical body portion not circumferentially corresponding to a position of the slit formed in the cylindrical body portion, thereby reducing an amount of gas discharged/outflowed through the slit, and
the cylindrical body has an asymmetrical shallow cylinder shape, the first portion of the cylindrical body opposite to the second portion has a first radius of curvature and the second portion has a second radius of curvature smaller than the first radius of curvature, and wherein the gateway and the exhaust hole are formed at different side surfaces of the chamber, and wherein the chamber insert is spaced apart from a first sidewall of the chamber including the exhaust hole by a first distance and from a second sidewall of the chamber including the gateway by a second distance, the second distance being greater than the first distance.

2. The apparatus of claim 1, wherein the chamber insert is arranged such that a third distance between a first side surface of the cylindrical body portion including the second protruding portion and an edge of the stage is larger than a fourth distance between a second side surface of the cylindrical body portion opposite to the first side surface of the cylindrical body portion and the edge of the stage.

3. The apparatus of claim 2, wherein the first portion of the cylindrical body portion is spaced apart from the chamber by a fifth distance and the second portion of the cylindrical body portion is spaced apart from the chamber by a sixth distance, the sixth distance being greater than the fifth distance.

4. The apparatus of claim 1, wherein the at least one hole is arranged at substantially a same elevation as the substrate.

5. An apparatus for processing a substrate, comprising:
a chamber including the substrate to be processed with a received source gas, the chamber including a gateway through which the substrate passes and an exhaust hole through which inner gases are exhausted;
a stage on which the substrate is positioned in the chamber;
a chamber insert including,
a cylindrical body portion including an open top end portion and an open bottom end portion, the cylindrical body portion including a slit and at least one hole, the slit and the at least one hole positioned circumferentially along the cylindrical body portion;
a first protruding portion extending outwardly from a first portion of the cylindrical body portion, the first portion positioned circumferentially along the cylindrical body portion; and
a second protruding portion extending outwardly from a second portion of the cylindrical body portion, the second portion positioned circumferentially along less than all of the cylindrical body portion, wherein
the slit is positioned at a side surface of the cylindrical body portion so as to circumferentially correspond to the second protruding portion, and at least one hole is formed in a position along the cylindrical body portion not circumferentially corresponding to a position of the slit formed in the cylindrical body portion, thereby reducing an amount of gas discharged/outflowed through the slit
the cylindrical body has an asymmetrical shape, the first portion of the cylindrical body opposite to the second portion has a first radius of curvature and the second portion has a second radius of curvature smaller than the first radius of curvature,
the gateway and the exhaust hole are formed at different side surfaces of the chamber, and
the chamber insert is spaced apart from a first sidewall of the chamber including the exhaust hole by a first distance and from a second sidewall of the chamber including the gateway by a second distance, the second distance being greater than the first distance.

* * * * *